United States Patent
Li et al.

(10) Patent No.: US 9,508,439 B2
(45) Date of Patent: Nov. 29, 2016

(54) NON-VOLATILE MULTIPLE TIME PROGRAMMABLE MEMORY DEVICE

(71) Applicant: QUALCOMM Incorporated, San Diego, CA (US)

(72) Inventors: Xia Li, San Diego, CA (US); Jeffrey Junhao Xu, San Diego, CA (US); Xiao Lu, San Diego, CA (US); Matthew Michael Nowak, San Diego, CA (US); Seung Hyuk Kang, San Diego, CA (US); Xiaonan Chen, San Diego, CA (US); Zhongze Wang, San Diego, CA (US); Yu Lu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 4 days.

(21) Appl. No.: 14/602,090

(22) Filed: Jan. 21, 2015

(65) Prior Publication Data
US 2016/0012896 A1 Jan. 14, 2016

Related U.S. Application Data

(60) Provisional application No. 62/023,474, filed on Jul. 11, 2014.

(51) Int. Cl.
| | |
|---|---|
| *G11C 16/10* | (2006.01) |
| *H01L 29/423* | (2006.01) |
| *H01L 29/792* | (2006.01) |
| *H01L 29/51* | (2006.01) |
| *G11C 16/26* | (2006.01) |
| *H01L 27/112* | (2006.01) |

(52) U.S. Cl.
CPC ............... *G11C 16/10* (2013.01); *G11C 16/26* (2013.01); *H01L 27/11246* (2013.01); *H01L 29/4234* (2013.01); *H01L 29/513* (2013.01); *H01L 29/517* (2013.01); *H01L 29/792* (2013.01)

(58) Field of Classification Search
CPC ..... G11C 16/10; G11C 16/26; H01L 29/513; H01L 29/517; H01L 29/792; H01L 29/4234
USPC .................................................. 365/185.18
See application file for complete search history.

(56) References Cited

U.S. PATENT DOCUMENTS

| | | | |
|---|---|---|---|
| 7,826,262 | B2 | 11/2010 | Wu et al. |
| 8,658,501 | B2 | 2/2014 | Guha et al. |

(Continued)

OTHER PUBLICATIONS

Internationalsearch Report and Written Opinion—PCT/US2015/035271—ISA/EPO—Feb. 9, 2016.

(Continued)

*Primary Examiner* — Hoai V Ho
*Assistant Examiner* — Tri Hoang
(74) *Attorney, Agent, or Firm* — Toler Law Group, PC

(57) ABSTRACT

An apparatus includes a multiple time programmable (MTP) memory device. The MTP memory device includes a metal gate, a substrate material, and an oxide structure between the metal gate and the substrate material. The oxide structure includes a hafnium oxide layer and a silicon dioxide layer. The hafnium oxide layer is in contact with the metal gate and in contact with the silicon dioxide layer. The silicon dioxide layer is in contact with the substrate material. The MTP device includes a transistor, and a non-volatile state of the MTP memory device is based on a threshold voltage of the transistor.

28 Claims, 14 Drawing Sheets

(56) References Cited

U.S. PATENT DOCUMENTS

| | | |
|---|---|---|
| 8,737,111 B2 | 5/2014 | Kreupl et al. |
| 2014/0035619 A1* | 2/2014 | Zaitsu .............. H03K 19/17764 326/41 |
| 2014/0061762 A1 | 3/2014 | Terai et al. |
| 2014/0063895 A1* | 3/2014 | Li ........................ H01L 27/22 365/97 |
| 2014/0138777 A1 | 5/2014 | Wang |
| 2015/0129975 A1* | 5/2015 | Zheng .................... H01L 45/04 257/379 |
| 2015/0131372 A1* | 5/2015 | Chih .................. G11C 16/3427 365/185.02 |

OTHER PUBLICATIONS

Buckley J., et al., "Investigation of SiO2/HfO2 Gate Stacks for Application to Non-Volatile Memory Devices", Solid State Electronics, Nov. 15, 2005, vol. 49, pp. 1833-1840.

Lee T., et al., "Reduced Gate-Leakage Current and Charge Trapping Characteristics of Dysprosium-Incorporated Hf02 Gate-Oxide n-MOS Devices", IEEE Transactions on Electron Devices, vol. 58, No. 2, pp. 562-566, Feb. 2, 2011.

Toriumi / Nagashio Laboratory: "Research Activities", Department of Materials Engineering, Graduate School of Engineering, The University of Tokyo, Retrieved from http://www.adam.t.u-tokyo.ac.jp/research_e.html, 8 pages.

Vandelli L., et al., "A Physical Model of the Temperature Dependence of the Current Through Si02/Hf02 Stacks", IEEE Transactions on Electron Devices, Sep. 2011, vol. 58, No. 9, pp. 2878-2887.

Yamamoto Y., et al., "Study of La Concentration Dependent VFB Shift in Metal/HfLaOx/Si Capacitors", Extended Abstracts of the 2006 International Conference on Solid State Devices and Materials, Yokohama, IEEE, Sep. 13-15, 2006, pp. 212-213.

Zhang Y., et al., "Temperature Dependant Characteristics of Scaled NMOS Transistors with Ultra-Thin High-K Dielectrics and Metal Gate Electrodes", International Semiconductor Device Research Symposium, Dec. 12-14, 2007, pp. 1-2.

* cited by examiner

First Non-Volatile Programmable State
(e.g., "Low Threshold Voltage Device")

Second Non-Volatile Programmable State
(e.g., "High Threshold Voltage Device")

First Non-Volatile Programmable State
(e.g., "Low Threshold Voltage Device")

Second Non-Volatile Programmable State
(e.g., "High Threshold Voltage Device")

Initial MTP Memory Device

MTP Memory Device during First Switch
Formation ("Set Formation")

MTP Memory Device during Second Switch
Formation ("Reset Formation")

MTP Memory Device during First Non-Volatile
State Programming

MTP Memory Device during First Non-Volatile
State Sensing

MTP Memory Device during Second Non-Volatile State Programming

MTP Memory Device during Second Non-Volatile State Sensing

NON-VOLATILE MULTIPLE TIME PROGRAMMABLE MEMORY DEVICE

I. CLAIM OF PRIORITY

The present application claims priority from U.S. Provisional Patent Application No. 62/023,474, entitled "NON-VOLATILE MULTIPLE TIME PROGRAMMABLE MEMORY DEVICE," filed Jul. 11, 2014, the contents of which are incorporated by reference in their entirety.

II. FIELD

The present disclosure is generally related to a non-volatile multiple time programmable memory device.

III. DESCRIPTION OF RELATED ART

Advances in technology have resulted in smaller and more powerful computing devices. For example, there currently exist a variety of portable personal computing devices, including wireless telephones such as mobile and smart phones, tablets and laptop computers that are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

Wireless telephones and other electronic devices may include memory devices to store information. Conventional memory devices may include volatile memory devices (e.g., memory devices that store data so long as a voltage is applied to the memory devices) and non-volatile memory devices (e.g., memory devices that store data regardless of whether voltage is applied to the memory devices). For example, metal-oxide semiconductor (MOS) transistors may be used in wireless telephones as volatile memory devices. However, conventional MOS transistors cannot store data in a non-volatile state.

IV. SUMMARY

Techniques and methods to store non-volatile programmable states in a multiple time programmable (MTP) memory device are disclosed. An MTP memory device may include a metal gate and a high dielectric constant (k) oxide layer (e.g., hafnium oxide). When the metal gate comes into contact with the hafnium oxide, a ferroelectric dipole and an electric field may be generated. A threshold voltage of the MTP memory device may be related to an orientation of the ferroelectric dipole and an orientation of the electric field. To illustrate, a threshold voltage of an n-type MTP device (e.g., an n-type metal oxide semiconductor (NMOS) transistor) may change based on an orientation of a ferroelectric dipole and an orientation of an electric field, based on an interface charge trap in a dielectric film, or based on a work function change. For post process devices, the threshold voltage change after electric switching may be based on the ferroelectric dipole or interface charge trapping. For example, the threshold voltage of the n-type MTP memory device may increase when the ferroelectric field has a "downward" orientation and an "upward" dipole, and the threshold voltage of the n-type MTP memory device may decrease when the ferroelectric field has an "upward" orientation and a "downward" dipole. The orientation of the ferroelectric field and the orientation of the dipole for a p-type MTP device (e.g., a p-channel metal oxide semiconductor (PMOS) transistor) may have a similar effect on the threshold voltage. For example, the threshold voltage of a p-type MTP device may increase when the ferroelectric field has an upward orientation and a "downward" dipole, and the threshold voltage of the p-type MTP memory device may decrease when the ferroelectric field has a downward orientation and an "upward" dipole.

In a particular aspect, an apparatus includes a multiple time programmable (MTP) memory device. The MTP memory device includes a metal gate, a substrate material, and an oxide structure between the metal gate and the substrate material. The oxide structure includes a hafnium oxide layer and a silicon dioxide layer. The hafnium oxide layer is in contact with the metal gate and in contact with the silicon dioxide layer. The silicon dioxide layer is in contact with the substrate material. The MTP device includes a transistor, and a non-volatile state of the MTP memory device is based on a threshold voltage of the transistor.

In another particular aspect, a method includes performing a write operation to program a multiple time programmable (MTP) memory device to a first non-volatile state or to a second non-volatile state. The MTP memory device includes a transistor including a metal gate, a substrate material, and an oxide structure between the metal gate and the substrate material. The oxide structure includes a hafnium oxide layer and a silicon dioxide layer. The hafnium oxide layer is in contact with the metal gate and is in contact with the silicon dioxide layer. The silicon dioxide layer is in contact with the substrate material. The method also includes performing a read operation to determine whether the MTP memory device has the first non-volatile state or the second non-volatile state. The MTP memory device has the first non-volatile state when the transistor has a first threshold voltage, and the MTP memory device has the second non-volatile state when the transistor has a second threshold voltage.

In another particular aspect, a non-transitory computer-readable medium includes instructions that, when executed by a processor, cause the processor to perform a write operation to program a multiple time programmable (MTP) memory device to a first non-volatile state or to a second non-volatile state. The MTP memory device includes a transistor including a metal gate, a substrate material, and an oxide structure between the metal gate and the substrate material. The oxide structure includes a hafnium oxide layer and a silicon dioxide layer. The hafnium oxide layer is in contact with the metal gate and is in contact with the silicon dioxide layer. The silicon dioxide layer is in contact with the substrate material. The instructions are further executable to cause the processor to perform a read operation to determine whether the MTP memory device has the first non-volatile state or the second non-volatile state. The MTP memory device has the first non-volatile state when the transistor has a first threshold voltage, and the MTP memory device has the second non-volatile state when the transistor has a second threshold voltage.

In another particular aspect, an apparatus includes means for receiving a gate voltage signal, means for conducting current, and means for isolating the means for conducting current from the means for receiving the gate voltage signal. The means for receiving the gate voltage signal, the means for conducting current, and the means for isolating are included in a multiple time programmable (MTP) memory device. The MTP memory device includes a transistor, and a non-volatile state of the MTP memory device is based on a threshold voltage of the transistor. The means for isolating includes means for altering a threshold voltage of the transistor. The means for altering the threshold voltage is in contact with the means for receiving the gate voltage signal and includes a hafnium oxide layer in contact with a silicon dioxide layer.

One particular advantage provided by at least one of the disclosed aspects is an ability to use a high dielectric constant (high-K) metal gate (HK/MG) device (e.g., a transistor having high-K dielectric interface coupled to a metal gate) as a non-volatile memory device. An HK/MG device (e.g., a complementary metal oxide semiconductor (CMOS) device) may be less expensive to manufacture than other non-volatile memory devices. Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

FIG. 1 includes a diagram of a multiple time programmable (MTP) memory device having a first non-volatile programmable state and a diagram of the MTP memory device having a second non-volatile programmable state;

Figure 1:
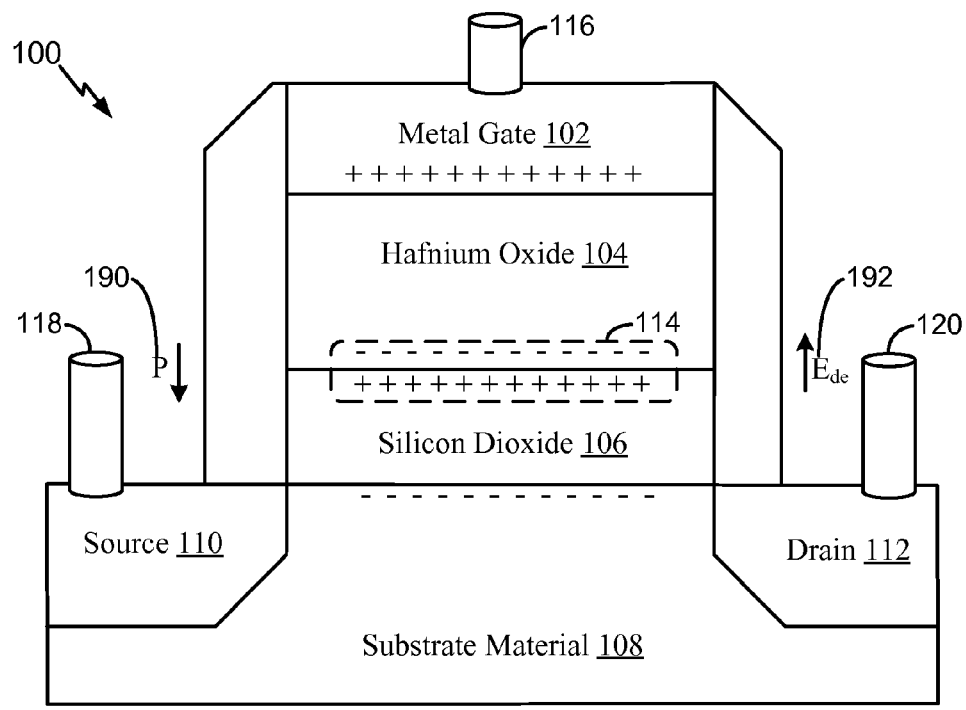
Figure 1:
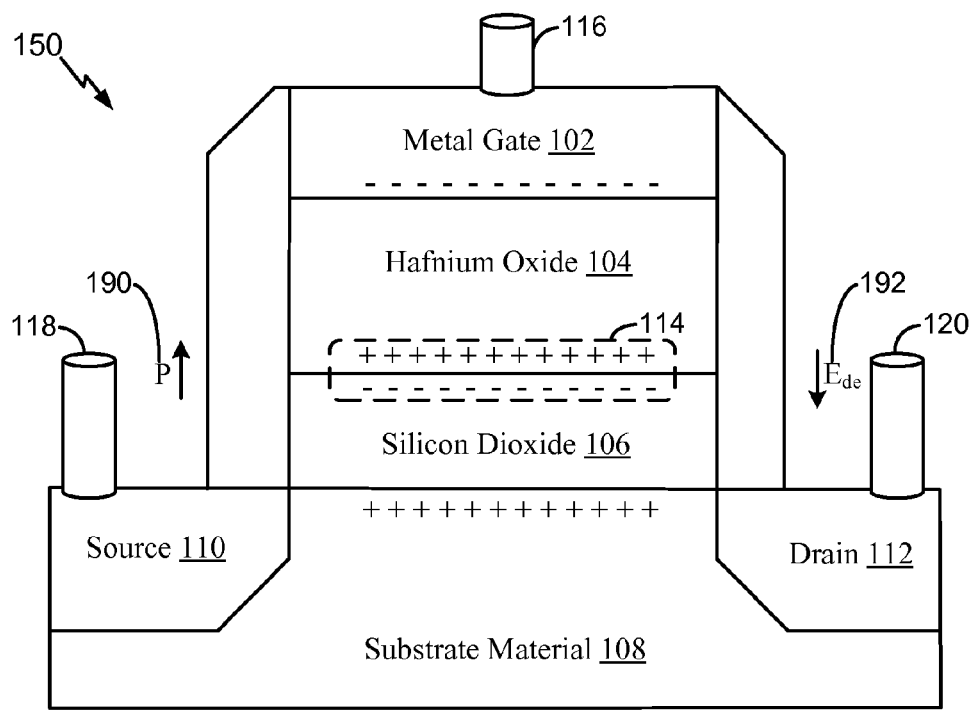
Figure 8:
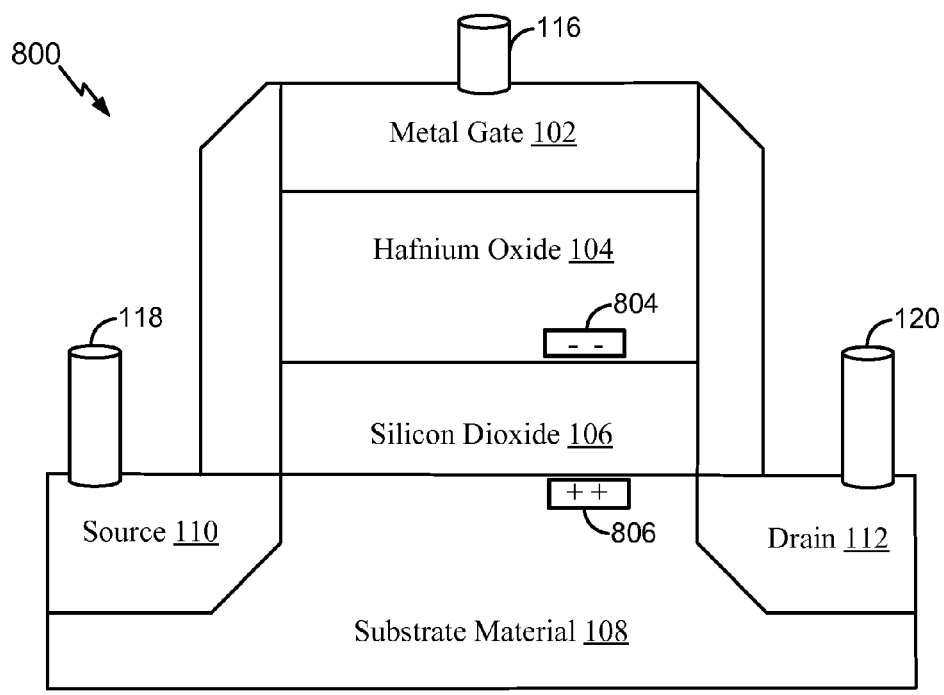
Figure 8:
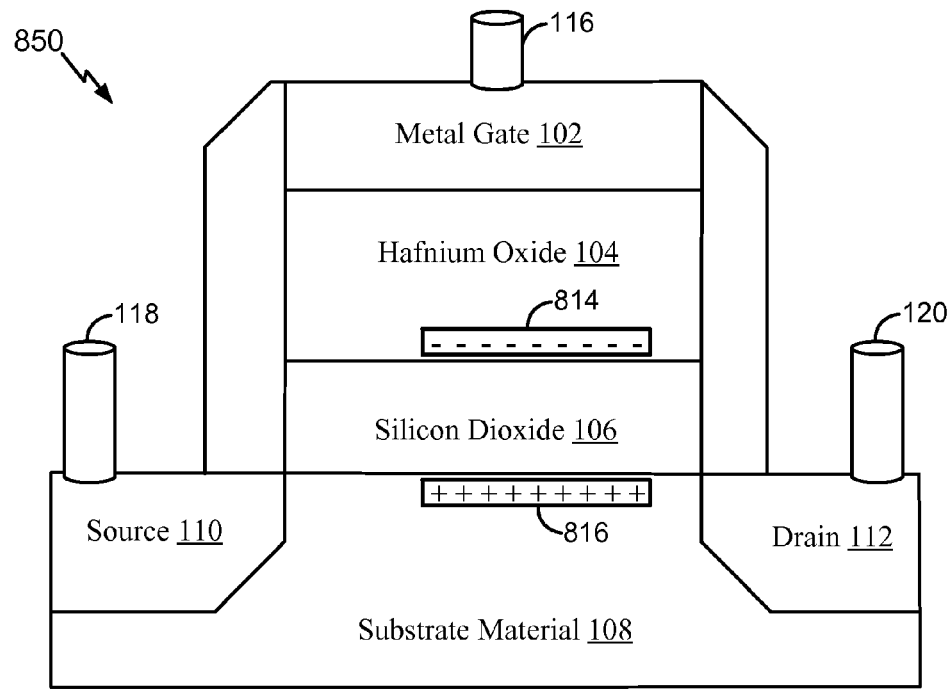
Figure 10:
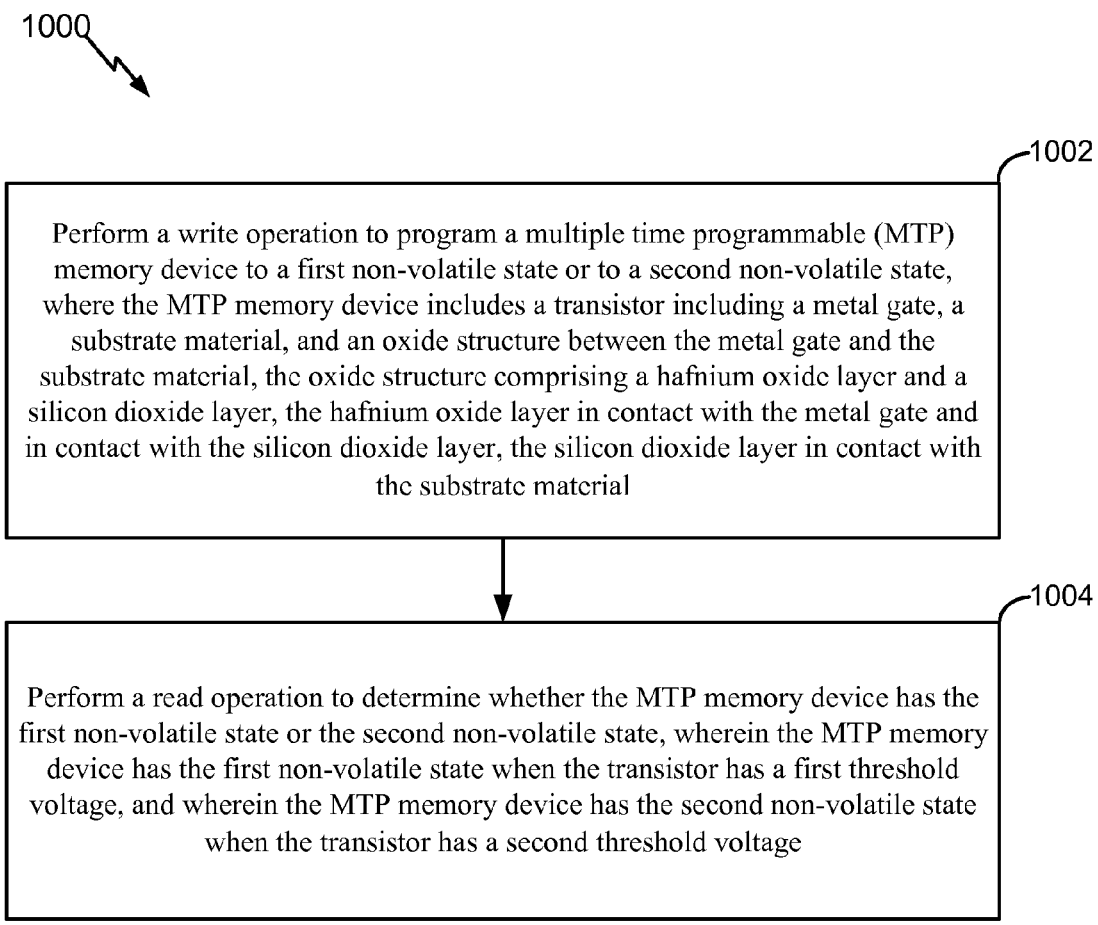
Figure 11:
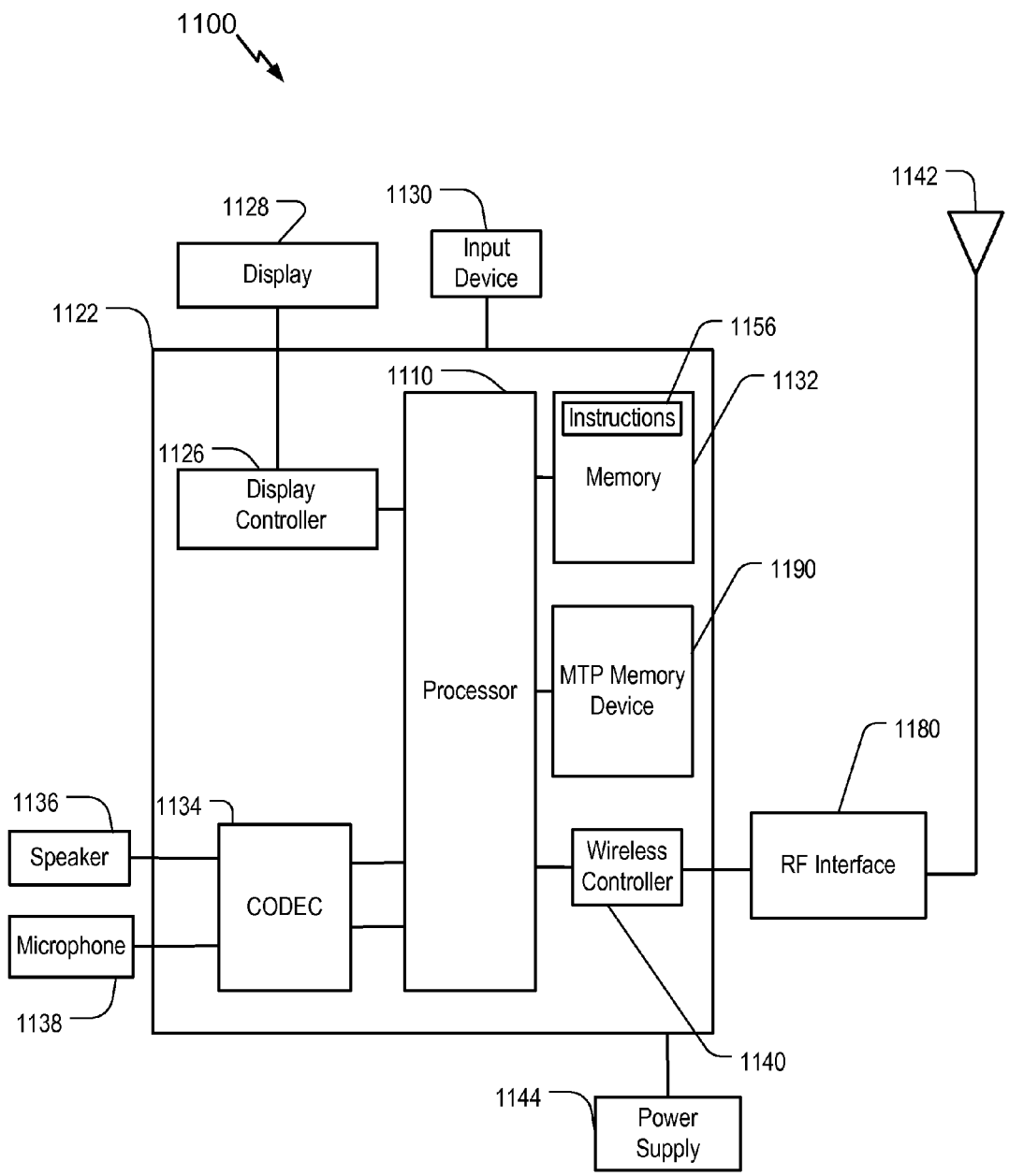

FIG. 8 includes a diagram of the MTP memory device of FIG. 1 having the first non-volatile programmable state based on charge carrier depletion and a diagram of the MTP memory device having the second non-volatile programmable state based on charge carrier accumulation;

FIGS. 9A-9D include diagrams of an MTP memory device that is programmable using floating gate techniques;

FIG. 10 is a flowchart of a particular aspect of a method for programming an MTP memory device; and FIG. 11 is a block diagram of a wireless device including a component operable to program an MTP memory device.

VI. DETAILED DESCRIPTION

According to the present disclosure, varying a threshold voltage of a multiple time programmable (MTP) memory device, and thus varying a flat-band voltage of the MTP memory device by ferroelectric dipole orientation, may cause the MTP memory device to operate in different modes. An n-type metal oxide semiconductor (NMOS) MTP memory device may operate in an increased accumulation mode when the flat-band voltage is increased by a first dipole orientation (corresponding to a ferroelectric field with a downward orientation and upward dipole), and the MTP memory device may operate in a decreased accumulation mode (or a weak inversion mode) when the flat-band voltage is decreased by a second dipole orientation (corresponding to a ferroelectric field with an upward orientation and downward dipole). When the dipole has the first orientation, the MTP memory device may have a first non-volatile programmable state. When the dipole has the second orientation, the MTP memory device may have a second non-volatile programmable state.

One technique that may be used to vary a flat band voltage (and thus vary the threshold voltage) may include switching an interface dipole and a ferroelectric field (e.g., an electric ferroelectric dipole) orientation between hafnium oxide and silicon dioxide. The silicon dioxide may be coupled between the hafnium oxide and a channel of the MTP memory device. The orientation (e.g., direction) of the dipole is opposite the orientation of the ferroelectric field. For example, if the dipole has an "upwards" orientation, the ferroelectric field will have a "downwards" orientation.

The orientation of the dipole between the hafnium oxide and the silicon dioxide may be switched based on a voltage provided to a metal gate that is in contact with the hafnium oxide. To illustrate with respect to an n-channel metal oxide semiconductor (NMOS) configuration, increasing the positive voltage applied to the gate may change the dipole orientation from a "downward" orientation to an "upward" orientation, and increasing the negative voltage applied to the metal gate may change the dipole orientation from an "upward" orientation to a downward" orientation. To illustrate with respect to a p-channel metal oxide semiconductor (PMOS) configuration, increasing the negative voltage applied to the metal gate may change the dipole orientation from an upward orientation to a downward orientation, and increasing the positive voltage applied to the metal gate may change the dipole orientation from a downward orientation to an upward orientation.

In an NMOS configuration, a dipole having a downward orientation (e.g., a ferroelectric field having an upward orientation) may reduce the threshold voltage of the MTP memory device such that the MTP memory device has a first non-volatile programmable state (e.g., a logic "0" state), and a dipole having an upward orientation (e.g., a ferroelectric field having a downward orientation) may increase the threshold voltage of the MTP memory device such that the MTP memory device has a second non-volatile programmable state (e.g., a logic "1" state). In a PMOS configuration, a dipole having an upward orientation (e.g., a ferroelectric field having a downward orientation) may reduce the threshold voltage of the MTP memory device such that the MTP memory device has the first non-volatile programmable state, and a dipole having a downward orientation (e.g., a ferroelectric field having an upward orientation) may increase the threshold voltage of the MTP memory device such that the MTP memory device has the second non-volatile programmable state.

Referring to FIG. 1, a first aspect 100 of a device and a second aspect 150 of the device is shown. In a particular aspect, the device may be a multiple time programmable (MTP) memory device. For example, the device may be a transistor that may be programmed to a first non-volatile programmable state or programmed to a second non-volatile programmable state. The first aspect 100 represents the device in the first non-volatile programmable state, and the second aspect 150 represents the device in the second non-volatile programmable state.

The device may include a metal gate 102, an oxide structure, a substrate material 108, a source 110, and a drain 112. The oxide structure includes a hafnium oxide (HfO$_2$) layer 104 and a silicon dioxide layer 106. The hafnium oxide layer 104 may be in contact with the metal gate 102 and in contact with the silicon dioxide layer 106. The silicon dioxide layer 106 may be in contact with the substrate material 108. In a particular aspect, the metal gate 102, the oxide structure, and the substrate material 108 may be integrated into at least one semiconductor die.

In a particular aspect, the device may be an n-type device (e.g., an n-type metal oxide semiconductor (NMOS) transistor). For example, the metal gate 102 may be an n-type metal gate, the substrate material 108 may include a p-type semiconductor material, the source 110 may include an n-type semiconductor material, and the drain 112 may include an n-type semiconductor material. In another particular aspect, the device may be a p-type device (e.g., a p-type metal oxide semiconductor (PMOS) transistor). For example, the metal gate 102 may be a p-type metal gate, the substrate material 108 may include an n-type semiconductor material, the source 110 may include a p-type semiconductor material, and the drain 112 may include a p-type semiconductor material.

Unless otherwise stated, the following description will correspond to a configuration where the device is an n-type device. However, it should be understood by those with ordinary skill in the art that the techniques, methods, and concepts may also be applied to a configuration where the device is a p-type device.

The non-volatile programmable state of the device may be based, at least in part, on a ferroelectric dipole (P) 190 and a ferroelectric field ($E_{de}$) 192 between the metal gate 102 and the substrate material 108. For example, the ferroelectric dipole (P) 190 and the ferroelectric field ($E_{de}$) 192 between the metal gate 102 and the substrate material 108 may be based on a dipole 114 (e.g., a ferroelectric interface dipole) between the hafnium oxide layer 104 and the silicon dioxide layer 106. In particular, the orientation (e.g., the location of positive and negative charges) of the dipole 114 is opposite of the orientation of the ferroelectric field ($E_{de}$) 192. The dipole 114 may be formed when the hafnium oxide layer 104 comes into contact with the silicon dioxide layer 106 as a result of the two layers 104, 106 having different chemical compositions and densities.

When the ferroelectric field ($E_{de}$) 192 has a first orientation (e.g., an "upward" orientation), the device may have the first non-volatile programmable state, as illustrated in the first aspect 100. When the ferroelectric field ($E_{de}$) 192 has a second orientation (e.g., a "downward" orientation), the device may have the second non-volatile programmable state, as illustrated in the second aspect 150. In a particular aspect, the first non-volatile programmable state corresponds to the device being programmed to a logical "0", and the second non-volatile programmable state corresponds to the device being programmed to a logical "1". However, in alternative aspects, the first non-volatile programmable state may correspond to the device being programmed to a logical "1", and the second non-volatile programmable state may correspond to the device being programmed to a logical "0".

Referring to the first aspect 100 of FIG. 1, when the dipole 114 is characterized by the accumulation of negative charges in the hafnium oxide layer 104 and positive charges in the silicon dioxide layer 106 (e.g., a downward dipole orientation) and forms ferroelectric dipoles, the orientation of the ferroelectric field ($E_{de}$) 192 is in the "upward" direction. When the dipole 114 has the downward orientation, a threshold voltage of the device may be relatively low. In a particular aspect, the downward orientation of the dipole 114 (e.g., the relatively low threshold voltage) may shift (e.g., reduce) a flat-band voltage of the device approximately 100 millivolts (mV) and may reduce a channel dopant (e.g., increase a size of a depletion region). Thus, the low threshold voltage may cause the device to represent the first non-volatile programmable state.

Alternatively, when the dipole 114 is characterized by the accumulation of positive charges in the hafnium oxide layer 104 and negative charges in the silicon dioxide layer (e.g., an upward dipole orientation) and forms ferroelectric dipoles, the orientation of the ferroelectric field ($E_{de}$) 192 is in the "downward" direction (as illustrated in the second aspect 150). When the dipole 114 has the upward orientation, the threshold voltage of the device may be relatively high. In a particular aspect, the upward orientation of the dipole 114 (e.g., the relatively high threshold voltage) may increase the flat-band voltage of the device and may relatively increase channel dopant (e.g., reduce the size of the depletion region). Thus, the high threshold voltage may cause the device to represent the second non-volatile programmable state.

Thus, switching the orientation of the dipole 114 may change the threshold voltage of the device and the non-volatile programmable state of the device. The orientation of the dipole 114 (and thus the non-volatile programmable state) may be based on a voltage applied to the metal gate 102, a voltage applied to the source 110, a voltage applied to the drain 112, and a voltage applied to the substrate material 108. A first contact 116 may be coupled to provide a first voltage (e.g., a gate voltage) to the metal gate 102, a second contact 118 may be coupled to provide a second voltage (e.g., a source voltage) to the source 110, a third contact 120 may be coupled to provide a third voltage (e.g., a drain voltage) to the drain 112, and a fourth contact (not shown) may be coupled to substrate material 108 to provide a fourth voltage (not shown).

Applying a positive gate voltage (e.g., a positive switching voltage) to the metal gate 102 via the first contact 116 may switch the orientation of the dipole 114 from a downward orientation to an upward orientation. Thus, applying the positive gate voltage to the metal gate 102 may change the non-volatile programmable state of the device from the first non-volatile programmable state to the second non-volatile programmable state. Applying a negative gate voltage (e.g., a negative switching voltage) to the metal gate 102 via the first contact 116 may switch the orientation of the dipole 114 from an upward orientation to a downward orientation. Thus, applying the negative gate voltage to the metal gate 102 may change the non-volatile programmable state of the device from the second non-volatile programmable state to the first non-volatile programmable state. The source 110, the drain 112, and the substrate material 108 may be biased based on a transistor operation state while the dipole orientation is switched by gate 102 voltage. The transistor typically has a similar sub threshold slope for the first non-volatile programmable state and the second non-volatile programmable state for dipole switching.

The techniques described with respect to FIG. 1 may be used for implementing high-dielectric constant (k) metal-gate (HK/MG) devices as non-volatile memory devices for logic circuits. For example, the device may be programmed to the first non-volatile programmable state (e.g., the first aspect 100) for use in a logic circuit or programmed to the second non-volatile programmable state (e.g., the second aspect 150) for use in a logic circuit. Switching the orientation of the dipole 114 of the device may enable the device to be used as a memory device (e.g., a non-volatile memory device).

Figure 2:
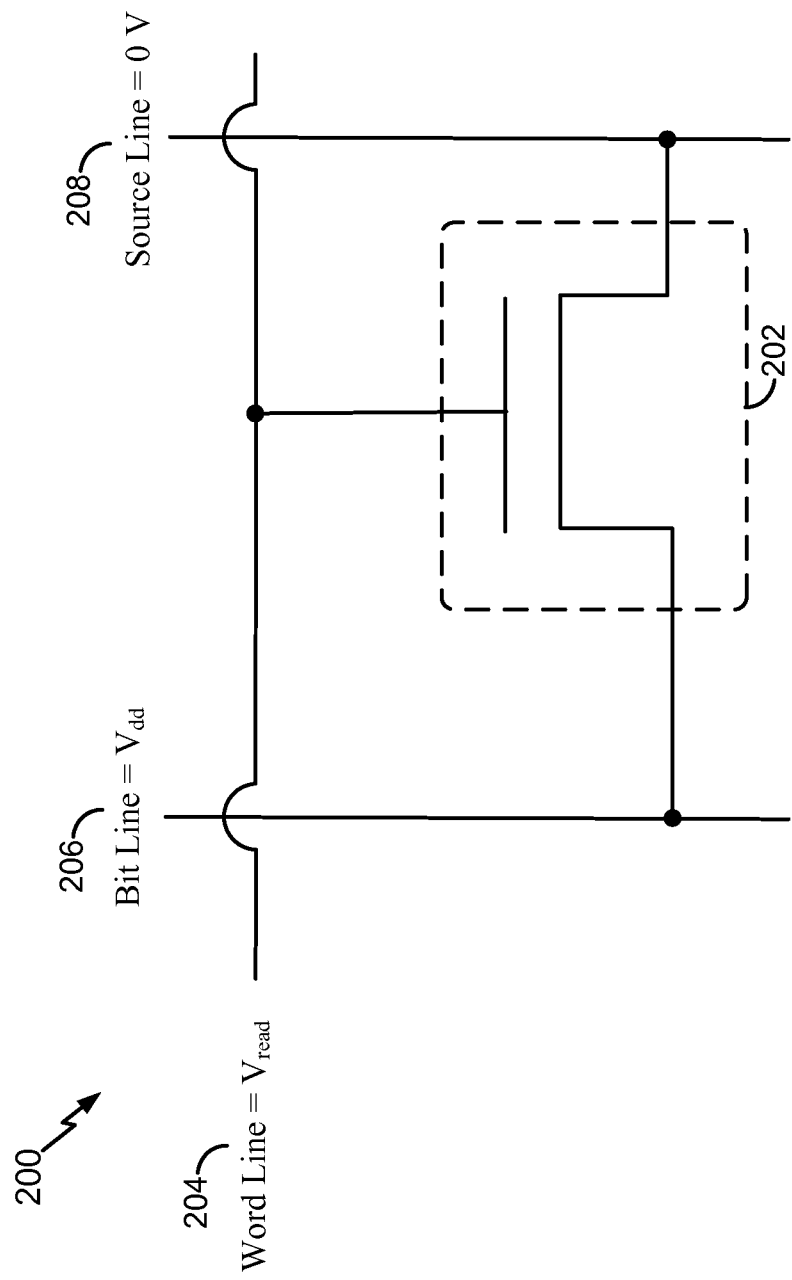
FIG. 2 is a diagram of a particular illustrative aspect of performing a read operation on a MTP memory device in a single transistor configuration.

Referring to FIG. 2, a diagram of a particular illustrative aspect 200 of performing a read operation on a multiple time programmable (MTP) memory device 202 in a single transistor configuration is shown. In a particular aspect, the MTP memory device 202 may correspond to the device of FIG. 1. A word line 204 may be coupled to a gate of the MTP memory device 202. For example, the word line 204 may be coupled to provide the gate voltage to the metal gate 102 of the device of FIG. 1 via the first contact 116. A bit line 206 may be coupled to a drain of the MTP memory device 202. For example, the bit line 206 may be coupled to provide the drain voltage to the drain 112 of the device of FIG. 1 via the third contact 120. A source line 208 may be coupled to a source of the MTP memory device 202. For example, the source line 208 may be coupled to provide the source voltage to the source 110 of the device of FIG. 1 via the second contact 118.

During a read operation (e.g., a sensing operation), the bit line 206 may apply a supply voltage (Vdd) to the drain of the MTP memory device 202, the source line 208 may apply a ground voltage (e.g., 0 V) to the source of the MTP memory device 202, and the word line 204 may apply a read voltage ($V_{read}$) to the gate of the MTP memory device 202.

If the ferroelectric field ($E_{de}$) of the MTP memory device 202 has an upward direction (e.g., if the MTP memory device 202 has the first non-volatile programmable state), the threshold voltage of the MTP memory device 202 may be relatively low. Thus, the read voltage ($V_{read}$) may be greater than the threshold voltage, causing a channel of the MTP memory device 202 to open (e.g., causing an inversion region of the MTP memory device 202 to increase) and current to flow from the source to the drain.

If the ferroelectric field ($E_{de}$) of the MTP memory device 202 has a downward direction (e.g., if the MTP memory device 202 has the second non-volatile programmable state), the threshold voltage of the MTP memory device 202 may be relatively high. Thus, in this case the read voltage ($V_{read}$) may be less than the threshold voltage, causing the channel to close (e.g., causing the depletion and accumulation region to increase) and to substantially prohibit current flow between the source and the drain.

A sensing amplifier may compare the "conductivity" of the MTP memory device 202 to that of a reference device (e.g., a reference transistor) to determine whether the MTP memory device 202 is in a state that corresponds to the first non-volatile state or to the second non-volatile state. For example, the current or voltage across the MTP memory device 202 (e.g., a first cell) may be compared to the current or voltage across the reference device (e.g., a second cell) to determine the non-volatile state of the MTP memory device 202.

The techniques described with respect to FIG. 2 may enable high-dielectric constant (k) metal-gate (HK/MG) devices (e.g., the MTP memory device 202) to be implemented as a non-volatile storage device. For example, non-volatile states corresponding to logic values may be sensed from the MTP memory device 202 based on an orientation of the ferroelectric dipole and an orientation of the ferroelectric field ($E_{de}$).

Figure 3:
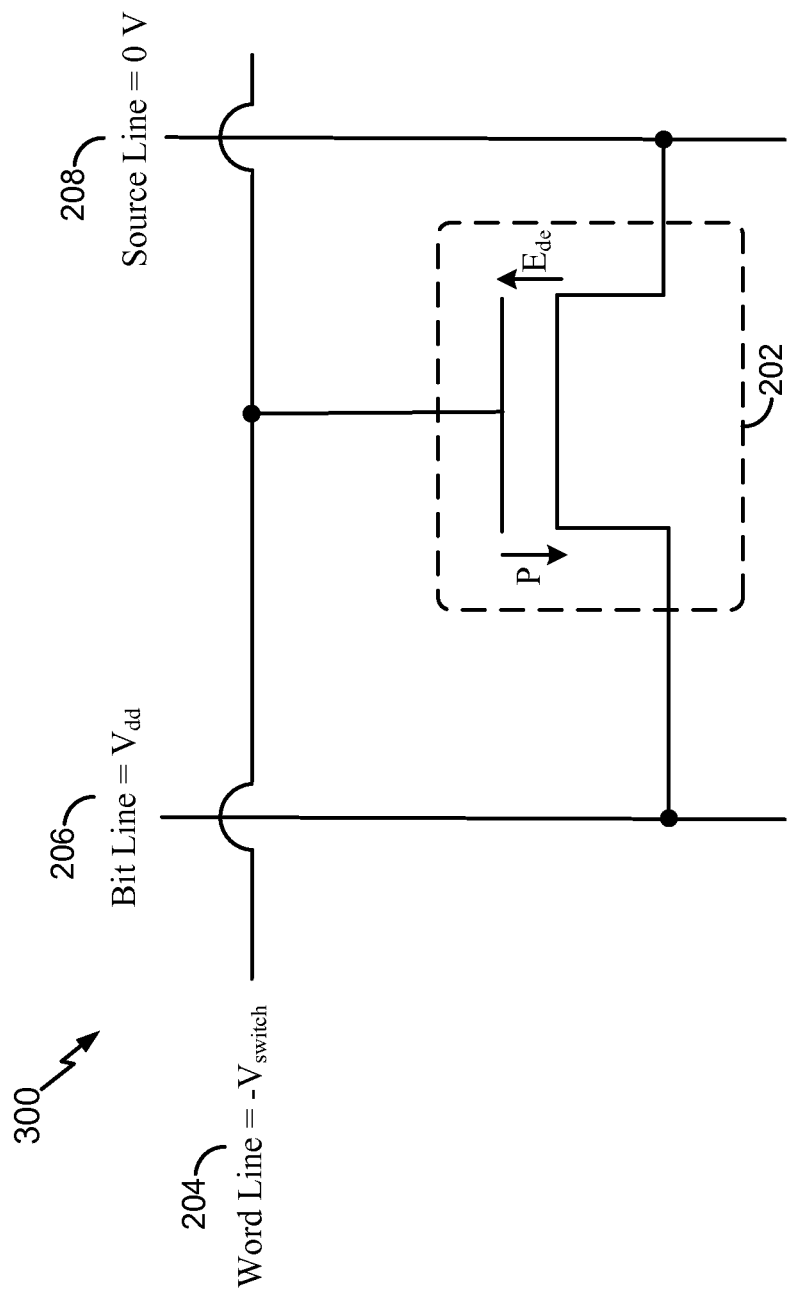
FIG. 3 is a diagram of a particular illustrative aspect of performing a first write operation on the MTP memory device of FIG. 2.

Referring to FIG. 3, a diagram of a particular illustrative aspect 300 of performing a first write operation on the MTP memory device 202 of FIG. 2 is shown.

During the first write operation, the bit line 206 may apply the supply voltage (Vdd) to the drain of the MTP memory device 202, the source line 208 may apply the ground voltage (e.g., 0 V) to the source of the MTP memory device 202, and the word line 204 may apply a switching voltage (e.g., $-V_{switch}$) to the gate of the MTP memory device 202. The switching voltage ($-V_{switch}$) applied to the gate of the MTP memory device 202 may cause the orientation of the ferroelectric field ($E_{de}$) of the MTP memory device 202 to change from the downward direction to the upward direction. For example, the switching voltage ($-V_{switch}$) may cause the orientation of a dipole (e.g., the dipole 114 of FIG. 1) to switch to the downward orientation as described with respect to the first aspect 100 of FIG. 1. Changing the orientation of the ferroelectric field ($E_{de}$) to the upward direction may change the non-volatile programmable state of the MTP memory device 202 from the second non-volatile programmable state to the first non-volatile programmable state.

The magnitude of the switching voltage ($-V_{switch}$) may be larger than the magnitude of the read voltage ($V_{read}$) in order to facilitate switching the non-volatile programmable state of the MTP memory device 202. However, the magnitude of the switching voltage ($-V_{switch}$) may be smaller than the gate breakdown voltage such that the gate of the MTP memory device 202 (e.g., the gate oxide 104 and 106) does not breakdown. Preventing the gate of the MTP memory device 202 from breaking down may enable the MTP memory device 202 to be programmed (e.g., re-programmed) to the second non-volatile programmable state, as described with respect to FIG. 4.

Figure 4:
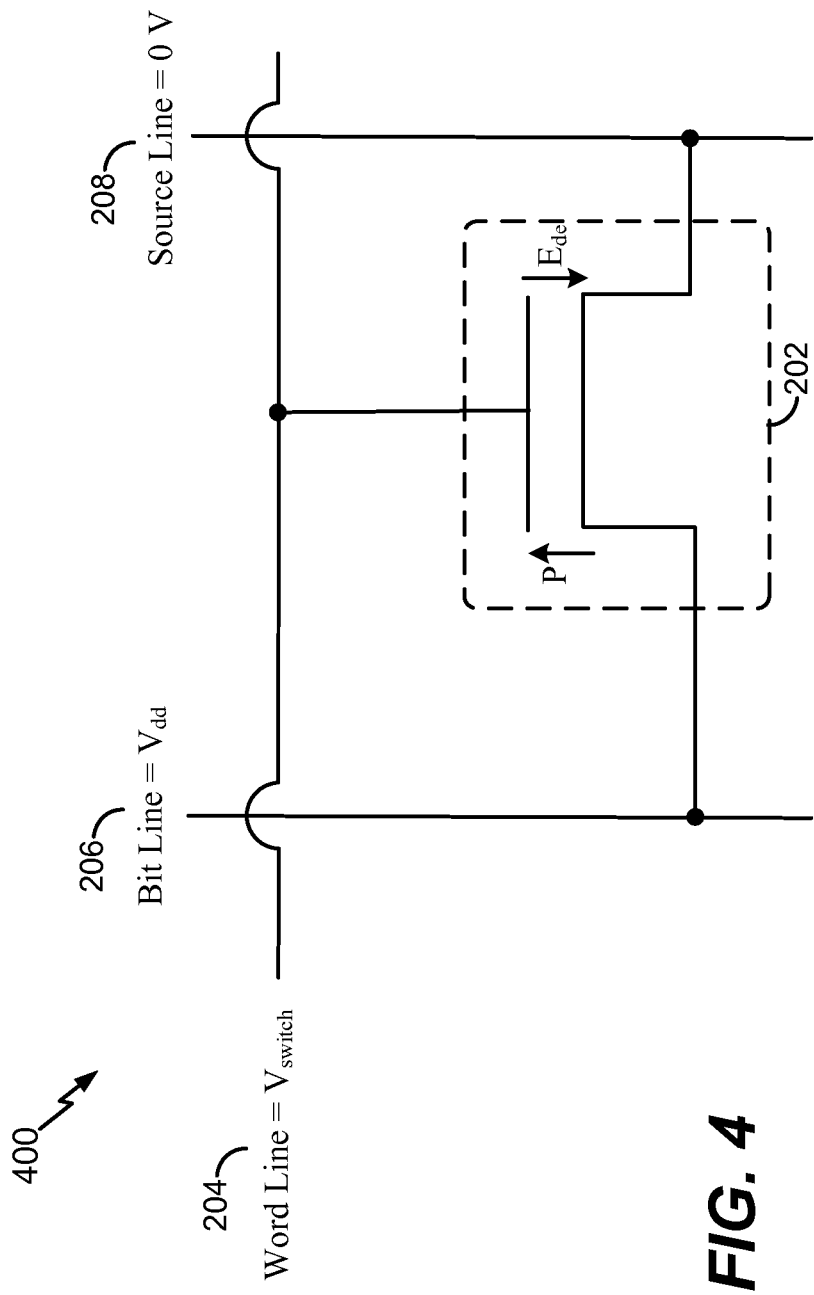
FIG. 4 is a diagram of a particular illustrative aspect of performing a second write operation on the MTP memory device of FIG. 2.

Referring to FIG. 4, a diagram of a particular illustrative aspect 400 of performing a second write operation on the MTP memory device 202 of FIG. 2 is shown.

During the second write operation, the bit line 206 may apply the supply voltage (Vdd) to the drain of the MTP memory device 202, the source line 208 may apply the ground voltage (e.g., 0 V) to the source of the MTP memory device 202, and the word line 204 may apply a switching voltage ($V_{switch}$) to the gate of the MTP memory device 202. The switching voltage ($V_{switch}$) applied to the gate of the MTP memory device 202 may cause the orientation of the ferroelectric field ($E_{de}$) of the MTP memory device 202 to change from the upward direction to the downward direction. For example, the switching voltage ($V_{switch}$) may cause the orientation of the dipole (e.g., the dipole 114 of FIG. 1) to switch to the upward orientation as described with respect to the second aspect 150 of FIG. 1. Changing the orientation of the ferroelectric field ($E_{de}$) to the downward direction may change the non-volatile programmable state of the MTP memory device 202 from the first non-volatile programmable state to the second non-volatile programmable state.

The magnitude of the switching voltage ($V_{switch}$) may be larger than the magnitude of the read voltage ($V_{read}$) in order to facilitate switching the non-volatile programmable state of the MTP memory device 202. However, the magnitude of the switching voltage ($V_{switch}$) may be smaller than the gate breakdown voltage such that the gate of the MTP memory device 202 (e.g., the gate oxide 104 and 106) does not breakdown.

Figure 5:
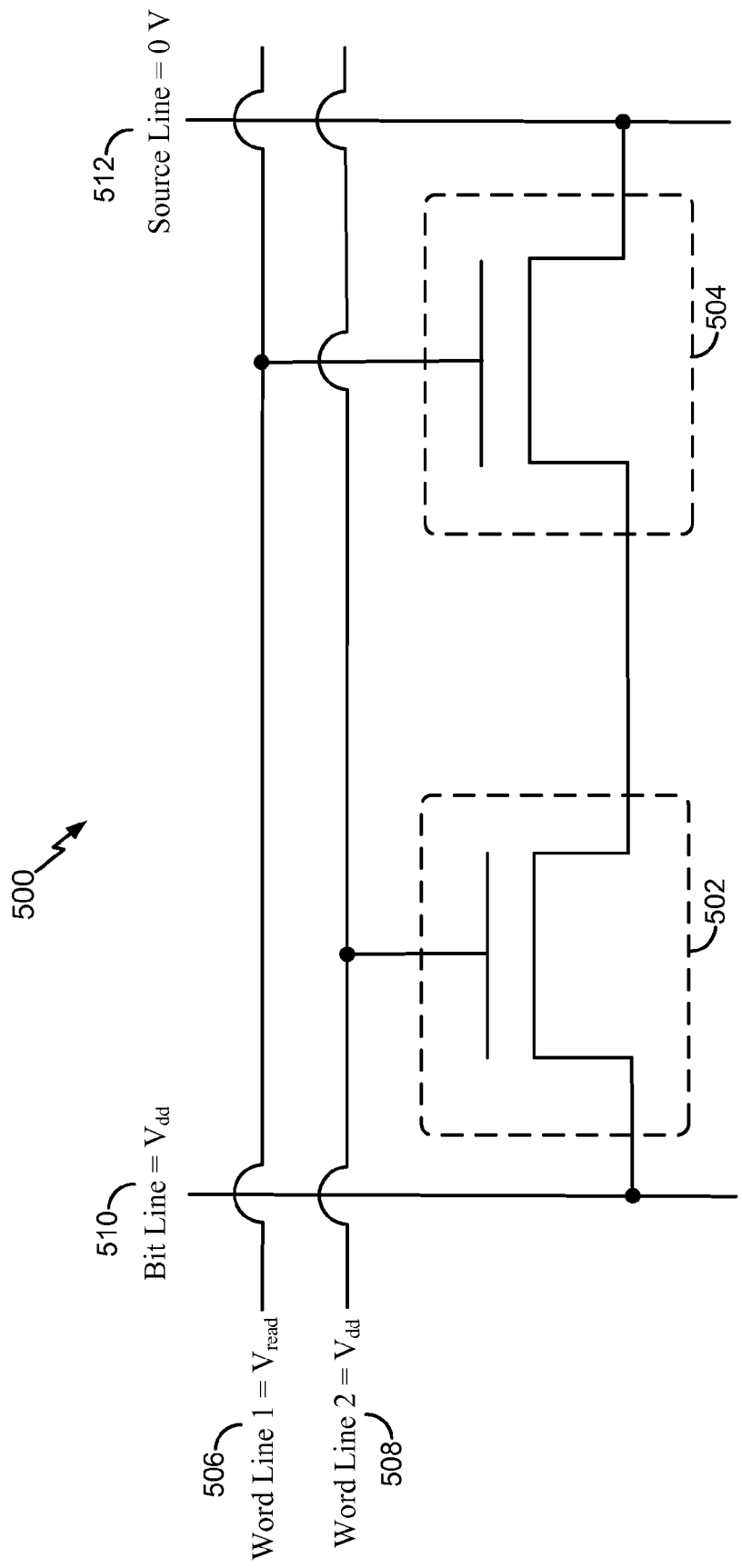
FIG. 5 is a diagram of a particular illustrative aspect of performing a read operation on a MTP memory device in a two-transistor configuration.

Referring to FIG. 5, a diagram of a particular illustrative aspect 500 of performing a read operation on a multiple time programmable (MTP) memory device 504 in a two-transistor configuration is shown. In a particular aspect, the MTP memory device 504 may correspond to the device of FIG. 1. An access transistor 502 may be coupled to the MTP memory device 504. The two-transistor configuration of FIG. 5 may enable a separate word line (e.g., a word line coupled to the access transistor 502) to control selection of the MTP memory device 504.

A first word line 506 may be coupled to a gate of the MTP memory device 504. For example, the first word line 506 may be coupled to provide the gate voltage to the metal gate 102 of the device of FIG. 1 via the first contact 116. A second word line 508 may be coupled to a gate of the access transistor 502.

A bit line 510 may be coupled to a drain of the of the access transistor 502, and a source line 512 may be coupled to a source of the MTP memory device 504. For example, the source line 512 may be coupled to provide the source voltage to the source 110 of the device of FIG. 1 via the second contact 118. A source of the access transistor 502 may be coupled to a drain of the MTP memory device 504. For example, the source of the access transistor 502 may be coupled to provide the drain voltage to the drain 112 of the device of FIG. 1 via the third contact 120.

During a read operation (e.g., a sensing operation), the bit line 510 may apply a supply voltage (Vdd) to the drain of the access transistor 502, and the source line 512 may apply a ground voltage (e.g., 0 V) to the source of the MTP memory device 504. The second word line 508 may apply the supply voltage (Vdd) to the gate of the access transistor 502 to enable conduction (e.g., cell selection). To determine (e.g., read) the non-programmable state of the MTP memory device 504, the first word line 506 may apply a read voltage ($V_{read}$) to the gate of the MTP memory device 504.

If the ferroelectric field ($E_{de}$) of the MTP memory device 504 has an upward direction (e.g., if the MTP memory device 504 has the first non-volatile programmable state), the threshold voltage of the MTP memory device 504 may be relatively low. Thus, the read voltage ($V_{read}$) may be greater than the threshold voltage, causing a channel of the MTP memory device 504 to open (e.g., causing an inversion region of the MTP memory device 504 to increase) and current (e.g., a first non-volatile state current) to flow from the source to the drain.

If the ferroelectric field ($E_{de}$) of the MTP memory device 504 has a downward direction (e.g., if the MTP memory device 504 has the second non-volatile programmable state), the threshold voltage of the MTP memory device 504 may be relatively high. Thus, in this case the read voltage ($V_{read}$) may be less than the threshold voltage, causing the channel to close (e.g., causing the accumulation region to increase) and substantially prohibiting current flow between the source and the drain. The read voltage ($V_{read}$) may be also larger than the threshold voltage, causing the channel to open (e.g., causing an inversion region of the MTP memory device 504 to increase) and current (e.g., a second non-volatile state current) to flow from the source to the drain. The first non-volatile state current may be larger than the second non-volatile state current, and the non-volatile state may be identified from the bit line 510 or the source line 512.

A sensing amplifier may compare the "conductivity" of the MTP memory device 504 to that of a reference device (e.g., a reference transistor) to determine whether the MTP memory device 504 is in a state that corresponds to the first non-volatile state or to the second non-volatile state. For example, the current or voltage across the MTP memory device 504 (e.g., a first cell) may be compared to the current or voltage across the reference device (e.g., a second cell) to determine the non-volatile state of the MTP memory device 504.

The techniques described with respect to FIG. 5 may enable high-dielectric constant (k) metal-gate (HK/MG) devices (e.g., the MTP memory device 504) to be implemented as a non-volatile storage device. For example, non-volatile states corresponding to logic values may be sensed from the MTP memory device 504 based on an orientation of the ferroelectric field ($E_{de}$).

Figure 6:
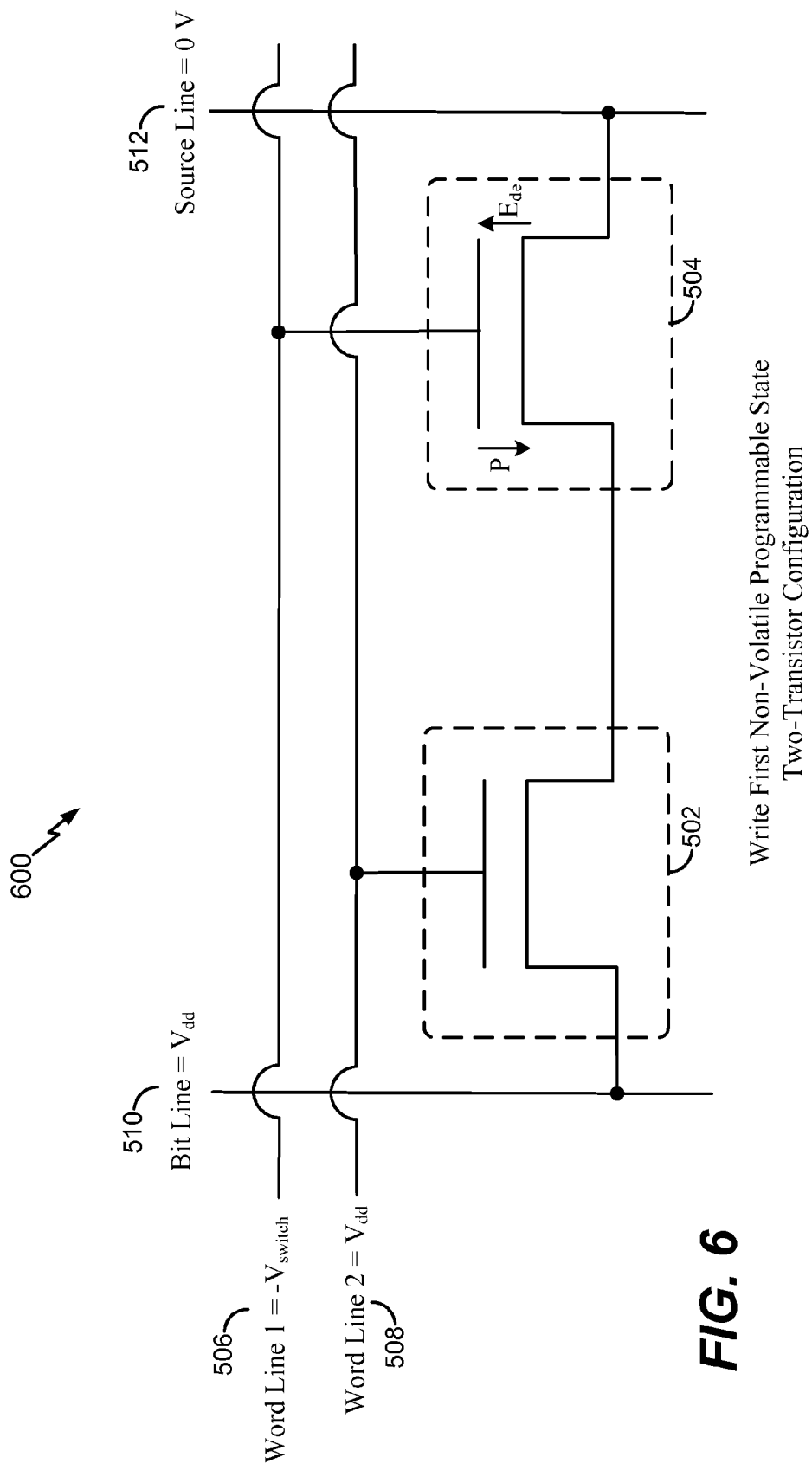
FIG. 6 is a diagram of a particular illustrative aspect of performing a first write operation on the MTP memory device of FIG. 5.

Referring to FIG. 6, a diagram of a particular illustrative aspect 600 of performing a first write operation on the MTP memory device 504 of FIG. 5 is shown.

During the first write operation, the bit line 510 may apply the supply voltage (Vdd) to the drain of the access transistor 502, the source line 512 may apply the ground voltage (e.g., 0 V) to the source of the MTP memory device 504, the second word line 508 may apply the supply voltage (Vdd) to the gate of the access transistor 502, and the first word line 506 may apply a switching voltage (e.g., $-V_{switch}$) to the gate of the MTP memory device 504. The switching voltage ($-V_{switch}$) applied to the gate of the MTP memory device 504 may cause the orientation of the ferroelectric field ($E_{de}$) of the MTP memory device 504 to change from the downward direction to the upward direction. For example, the switching voltage ($-V_{switch}$) may cause the orientation of a dipole (e.g., the dipole 114 of FIG. 1) to switch to the downward orientation as described with respect to the first aspect 100 of FIG. 1. Changing the orientation of the ferroelectric field ($E_{de}$) to the upward direction may change the non-volatile programmable state of the MTP memory device 504 from the second non-volatile programmable state to the first non-volatile programmable state.

The magnitude of the switching voltage ($-V_{switch}$) may be larger than the magnitude of the read voltage ($V_{read}$) in order to facilitate switching the non-volatile programmable state of the MTP memory device 504. However, the magnitude of the switching voltage ($-V_{switch}$) may be smaller than the gate breakdown voltage such that the gate of the MTP memory device 504 (e.g., the metal gate 102) does not breakdown. Preventing the gate of the MTP memory device 504 from breaking down may enable the MTP memory device 504 to be programmed (e.g., re-programmed) to the second non-volatile programmable state, as described with respect to FIG. 7.

Figure 7:
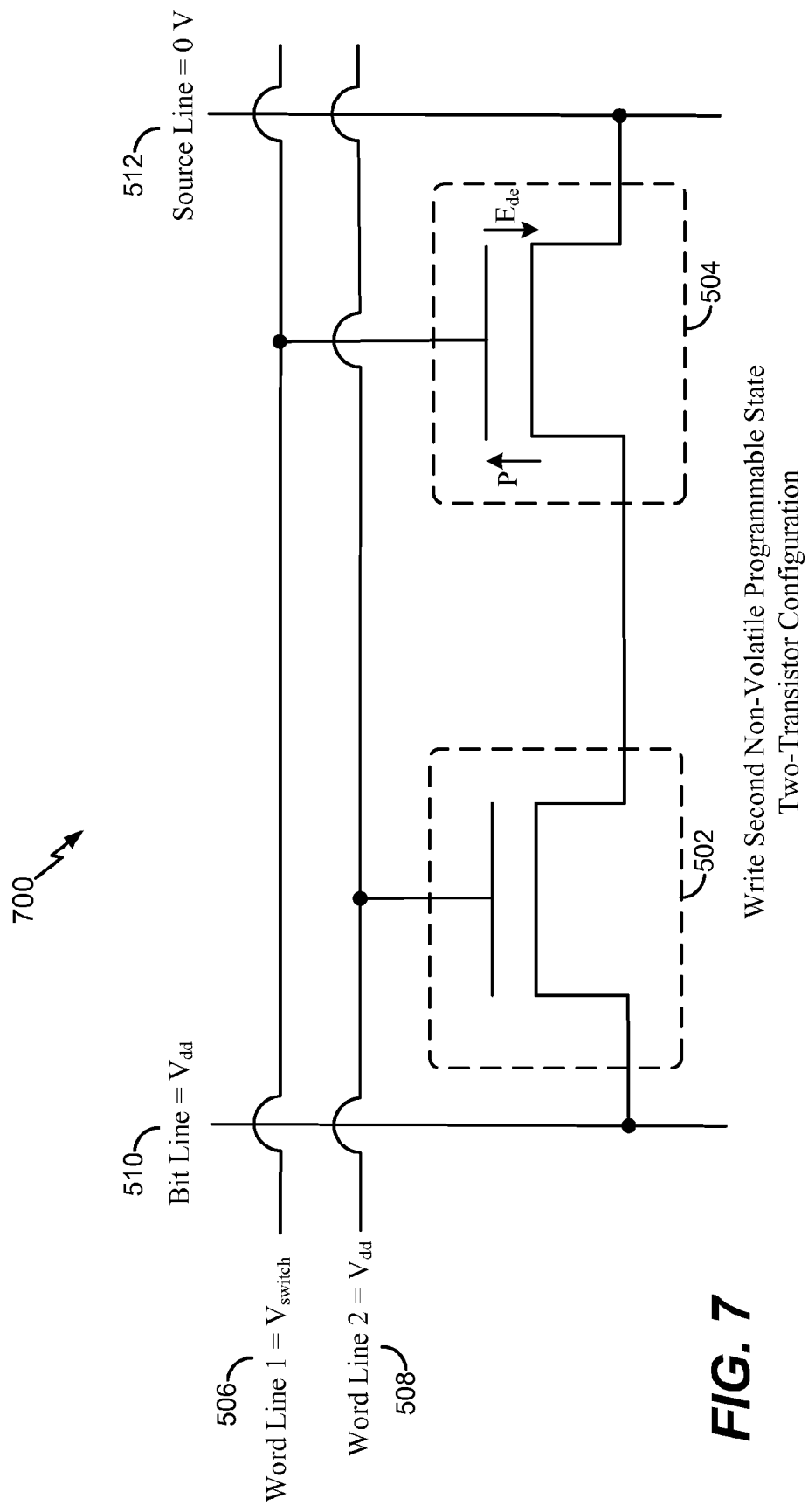
FIG. 7 is a diagram of a particular illustrative aspect of performing a second write operation on the MTP memory device of FIG. 5.

Referring to FIG. 7, a diagram of a particular illustrative aspect 700 of performing a second write operation on the MTP memory device 504 of FIG. 5 is shown.

During the second write operation, the bit line 510 may apply the supply voltage (Vdd) to the drain of the access transistor 502, the source line 512 may apply the ground voltage (e.g., 0 V) to the source of the MTP memory device 504, the second word line 508 may apply the supply voltage (Vdd) to the gate of the access transistor 502, and the first word line 506 may apply a switching voltage ($V_{switch}$) to the gate of the MTP memory device 504. The switching voltage ($V_{switch}$) applied to the gate of the MTP memory device 504 may cause the orientation of the ferroelectric field ($E_{de}$) of the MTP memory device 504 to change from the upward direction to the downward direction. For example, the switching voltage ($V_{switch}$) may cause the orientation of the dipole (e.g., the dipole 114 of FIG. 1) to switch to the upward orientation as described with respect to the second aspect 150 of FIG. 1. Changing the orientation of the ferroelectric field ($E_{de}$) to the downward direction may change the non-volatile programmable state of the MTP memory device 504 from the first non-volatile programmable state to the second non-volatile programmable state.

The magnitude of the switching voltage ($V_{switch}$) may be larger than the magnitude of the read voltage ($V_{read}$) in order to facilitate switching the non-volatile programmable state of the MTP memory device 504. However, the magnitude of the switching voltage ($V_{switch}$) may be smaller than the gate breakdown voltage such that the gate of the MTP memory device 504 (e.g., the metal gate 102) does not breakdown.

Referring to FIG. 8, a third aspect 800 of the device of FIG. 1 and a fourth aspect 850 of the device is shown. The threshold voltage of the device may be decreased or increased based on a charge trap accumulation in the hafnium oxide layer 104.

For example, according to the third aspect 800, a relatively small number of electrons 804 may be present in the hafnium oxide layer 104, which in turn, may cause a relatively small amount of positive imaging charge 806 in the silicon channel (e.g., the portion of the substrate material between the source 110 and the drain 112). As described with respect to FIG. 8, the threshold voltage of the device may be reduced when the relatively small amount of imaging charge 806 is a smaller than an amount of accumulative substrate dopant. Based on the low threshold voltage, the state of the device may correspond to the first non-volatile programmable state.

According to the fourth aspect 850, a relatively large number of electrons 814 may be present in the hafnium oxide layer 104, which in turn, may cause a relatively large amount of positive imaging charge 816 in the silicon channel. As described with respect to FIG. 8, the threshold voltage of the device may be increased when the relatively large amount of imaging charge 816 is larger than an amount of accumulative substrate dopant. Based on the high threshold voltage, the state of the device may correspond to the second non-volatile programmable state. For charge trap programming, the sub threshold slope of the device may be increased after programming.

The techniques described with respect to FIG. 8 may be used for implementing HK/MG devices as non-volatile memory devices for logic circuits. For example, controlling (e.g., injection and/or removing) the amount of electrons 804, 814 in the oxide structure (e.g., "electron trapping") may change the threshold voltage of the device, which in turn, may program the device in the first or second non-volatile programmable state.

Figure 9A:
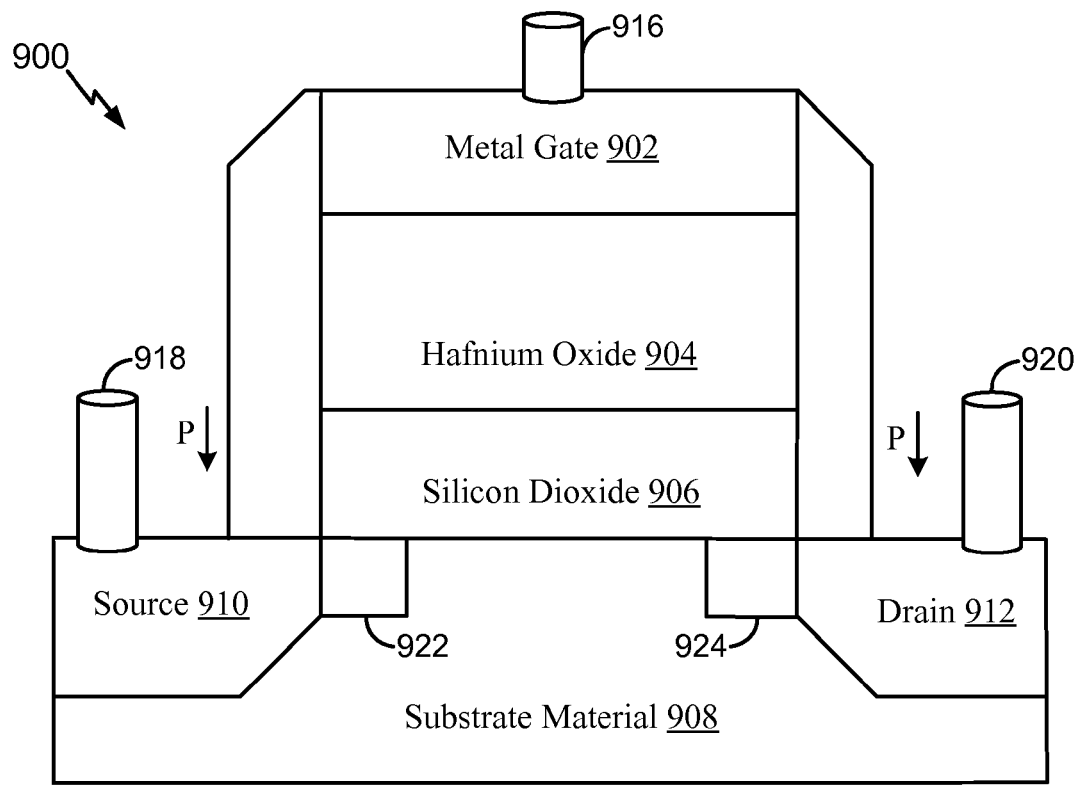

Referring to FIG. 9A, a particular illustrative aspect 900 of an MTP memory device that is programmable using floating gate techniques is shown. The aspect 900 of FIG. 9A depicts an initial MTP memory device (e.g., the MTP memory device prior to switch formation and prior to non-volatile state programming, as described below). FIGS. 9A-9D illustrate a single process for programming the MTP memory device using floating gate techniques.

The device may include a metal gate 902, a hafnium oxide layer 904 (e.g., a high-k oxide layer), a silicon dioxide layer 906, substrate material 908, a source 910, and a drain 912. As used herein, the hafnium oxide layer 904 and the silicon dioxide layer 906 may be referred to as an "oxide layer". In a particular aspect, the device may be an n-type device (e.g., an n-type metal oxide semiconductor (NMOS) transistor). For example, the metal gate 902 may be an n-type metal gate, the substrate material 908 may include a p-type semiconductor material, the source 910 may include an n-type semiconductor material, and the drain 912 may include an n-type semiconductor material. In another aspect, the device may be a p-type device (e.g., a p-type metal oxide semiconductor (PMOS) transistor). For example, the metal gate 902 may be a p-type metal gate, the substrate material 908 may include an n-type semiconductor material, the source 910 may include a p-type semiconductor material, and the drain 912 may include a p-type semiconductor material.

Unless otherwise stated, the following description corresponds to a configuration in which the device is an n-type device. However, it should be understood by those with ordinary skill in the art that the techniques, methods, and concepts may also be applied to a configuration in which the device is a p-type device.

The device includes a source overlap region 922 and a drain overlap region 924. The source overlap region 922 may correspond to a particular area of the source 910 that extends under the metal gate 902, the hafnium oxide layer 904, and silicon dioxide layer 906. The drain overlap region 924 may correspond to a particular area of the drain 912 that extends under the metal gate 902, the hafnium oxide layer 904, and silicon dioxide layer 906. The overlap regions 922, 924 may have a lightly doped concentration as opposed to the source/drain 910, 912 with a heavily doped concentration. For example, if the source/drain 910, 912 is doped with an N+ concentration, the overlap regions 922, 924 may have a lightly doped N+ concentration as compared to the remaining area of the source/drain 910, 912 for NMOS.

A first contact 916 may be coupled to provide a first voltage (e.g., a gate voltage) to the metal gate 902, a second contact 918 may be coupled to provide a second voltage (e.g., a source voltage) to the source 910, and a third contact 920 may be coupled to provide a third voltage (e.g., a drain voltage) to the drain 912.

The non-volatile programmable state of the device may be based, at least in part, on a ferroelectric dipole (P) and a ferroelectric field between the metal gate 902 and the substrate material 908. For example, the ferroelectric dipole (P) and the ferroelectric field between the metal gate 902 and the substrate material 908 may be based on a dipole between the hafnium oxide layer 904 and the silicon dioxide layer 906, such as described with respect to FIG. 1. The dipole (P) may be formed when the hafnium oxide layer 904 comes into contact with the silicon dioxide layer 906 as a result of the two layers 904, 906 having different chemical compositions and densities. The dipole (P) may have a downward orientation at the initial stage. For example, a threshold voltage of the MTP memory device may be relatively low based on the downward orientation of the dipole (P).

Figure 9B:
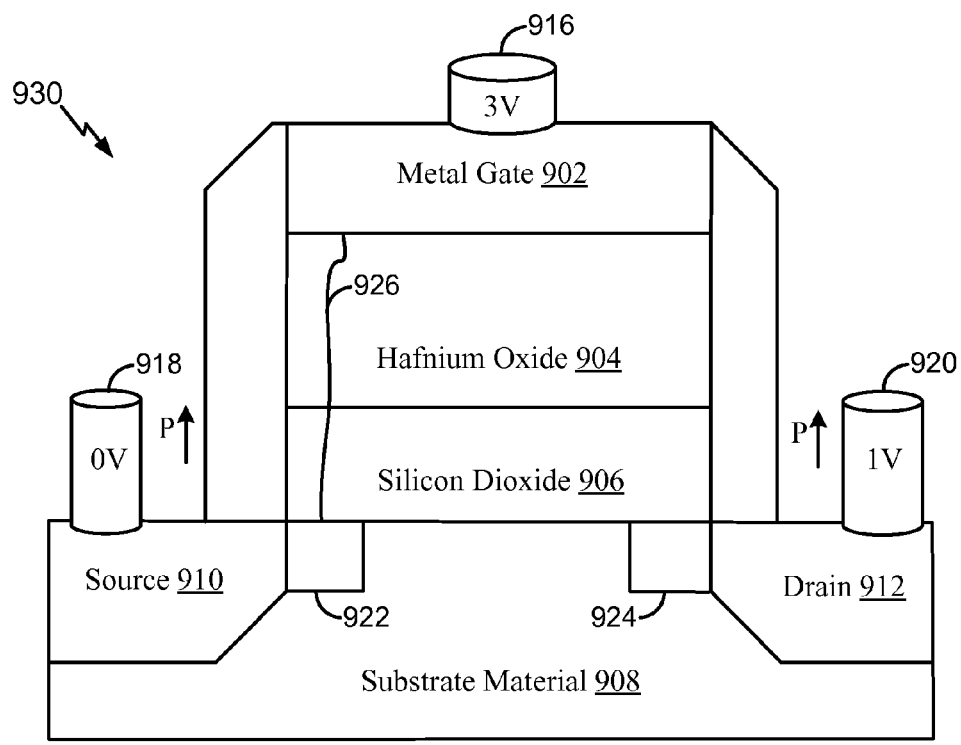
Figure 9B:
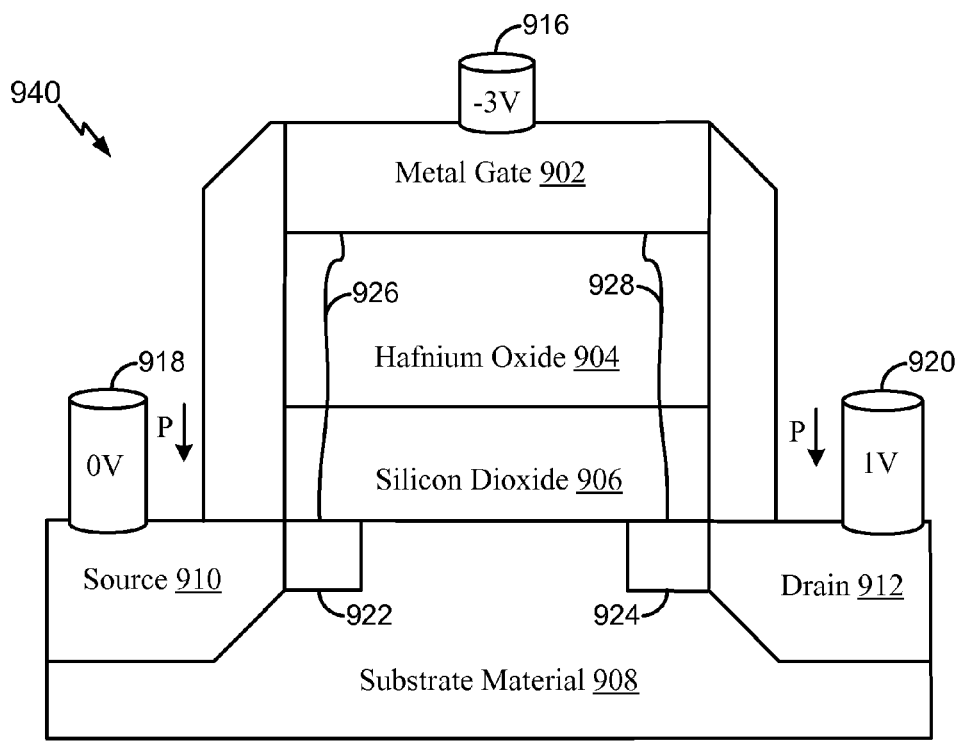

Another aspect 930 of the MTP memory device is shown in FIG. 9B. The techniques described with respect to the aspect 930 of the memory device may be performed after the techniques described with respect to the aspect 900. In the aspect 930, a soft breakdown condition occurs to form a conductive path 926 between the metal gate 902 and the source overlap region 922. For example, the first contact 916 may apply a gate voltage of approximately 3V to the metal gate 902, and the second contact 918 may apply a source voltage of approximately 0V to the source 910. The voltage difference between the metal gate 902 and the source 910 may cause the soft conductive path 926 to form between the metal gate 902 and the source overlap region 922. The third contact 920 may apply a drain voltage of approximately 1V to the drain 912 such that the voltage difference between the metal gate 902 and the drain 912 (e.g., approximately 2V) does not create a breakdown condition.

In the aspect 930, a first switch (e.g., the conductive path 926) may be formed at the MTP memory device. Formation of the first switch may be referred to as a "set formation." The dipole (P) may have an upward orientation corresponding to a first non-volatile state in the set formation. The threshold voltage of the MTP memory device in the set formation may be relatively high based on the upward orientation of the dipole (P).

Another aspect 940 of the MTP memory device is shown in FIG. 9B. The techniques described with respect to the aspect 940 of the memory device may be performed after the techniques described with respect to the aspect 930. In the aspect 940, a soft breakdown condition occurs resulting in a conductive path 928 between the metal gate 902 and the drain overlap region 924. For example, the first contact 916 may apply a gate voltage of approximately −3V to the metal gate 902, and the third contact 920 may apply a drain voltage of approximately 1V to the drain 912. The voltage difference between the metal gate 902 and the drain 912 may cause the soft conductive path 928 to form between the metal gate 902 and the drain overlap region 924. The second contact 918 may apply a source voltage of approximately 0V to the source 910.

In the aspect 940, a second switch (e.g., the conductive path 928) may be formed at the MTP memory device. Formation of the second switch may be referred to as a "reset formation." The dipole (P) may have a downward orientation corresponding to a second non-volatile state in the reset formation. The threshold voltage of the MTP memory device in the reset formation may be relatively low based on the downward orientation of the dipole (P).

Figure 9C:
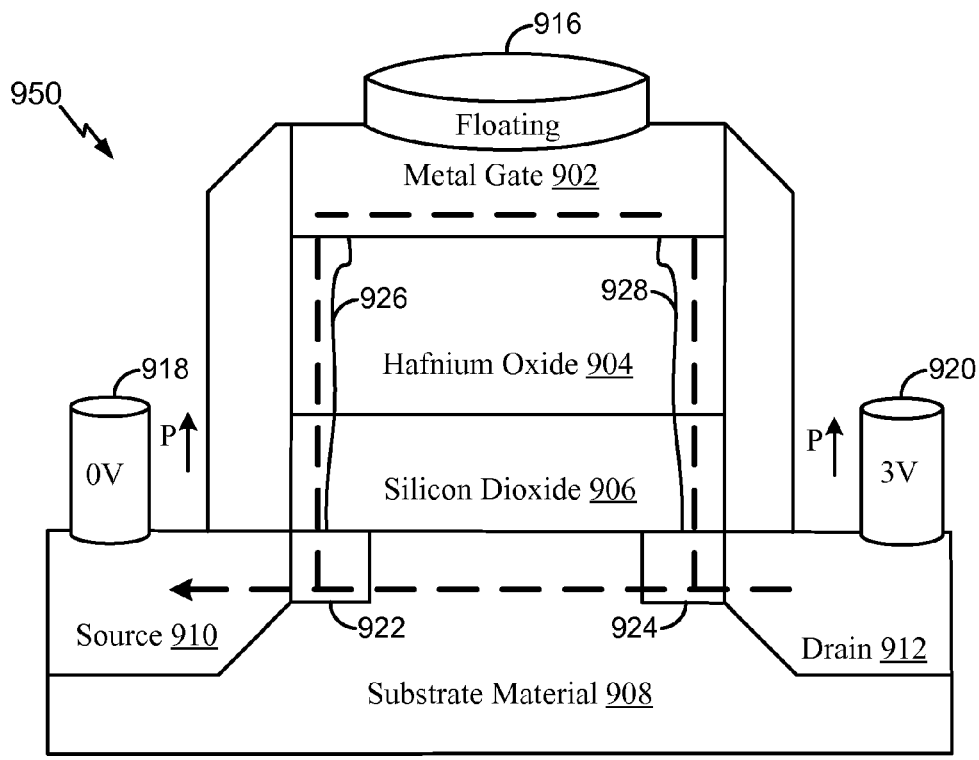
Figure 9C:
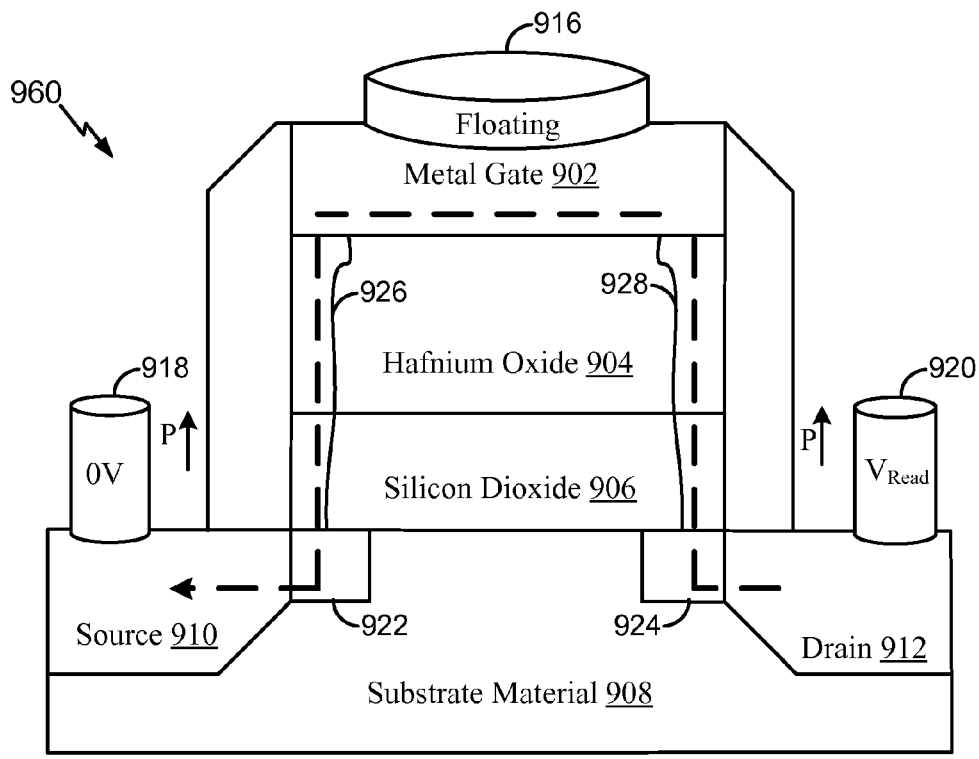

Another aspect 950 of the MTP memory device is shown in FIG. 9C. The techniques described with respect to the aspect 950 of the memory device may be performed after the techniques described with respect to the aspect 940. In the aspect 950, the first non-volatile state is programmed (e.g., written) at the MTP memory device using floating gate techniques. For example, the MTP memory device may be programmed to the first non-volatile state by applying voltages to the source 910 and to the drain 912, while no voltage is applied to the metal gate 902 (e.g., the metal gate 902 is a "floating gate").

To illustrate, the second contact 918 may apply a source voltage of approximately 0V to the source 910, and the third contact 920 may apply a drain voltage of approximately 3V to the drain 912. Based on the voltage difference between the source/drain 910, 912 and the conductive paths 926, 928 formed during set/reset formations, current may flow from the drain 912 to the source 910, n-type carrier (electrons) may flow from the drain 910 to the source 912. For example, a channel in the substrate material 908 may form between the drain 912 and the source 910 and n-type ions (electrons) may flow through the channel. Additionally, n-type ions (electrons) may flow from the drain 910 to the source 912 via the conductive paths 926, 928 and the metal gate 902.

Based on the ion conduction, the dipole (P) may be placed in an upward orientation corresponding to the first non-volatile state. The threshold voltage of a transistor (e.g., the MTP memory device) may be relatively high based on the upward orientation of the dipole (P).

Another aspect 960 of the MTP memory device is shown in FIG. 9C. The techniques described with respect to the aspect 960 of the memory device may be performed after the techniques described with respect to the aspect 950. In the aspect 960, the first non-volatile state is sensed (e.g., read) at the MTP memory device using floating gate techniques. For example, the first non-volatile state may be sensed at the MTP memory device by applying voltages to the source 910 and to the drain 912, while no voltage is applied to the metal gate 902.

To illustrate, the second contact 918 may apply a source voltage of approximately 0V to the source 910, and the third contact 920 may apply the read voltage ($V_{read}$) to the drain 912. A sensing current may flow from the drain 912 to the source 910 via the conductive paths 926, 928 and the metal gate 902. A sensing amplifier may compare the "conductivity" of the MTP memory device to that of a reference device (e.g., a reference transistor) to determine whether the MTP memory device is in a state that corresponds to the first non-volatile state or to the second non-volatile state in a similar manner as described with respect to FIG. 2.

Figure 9D:
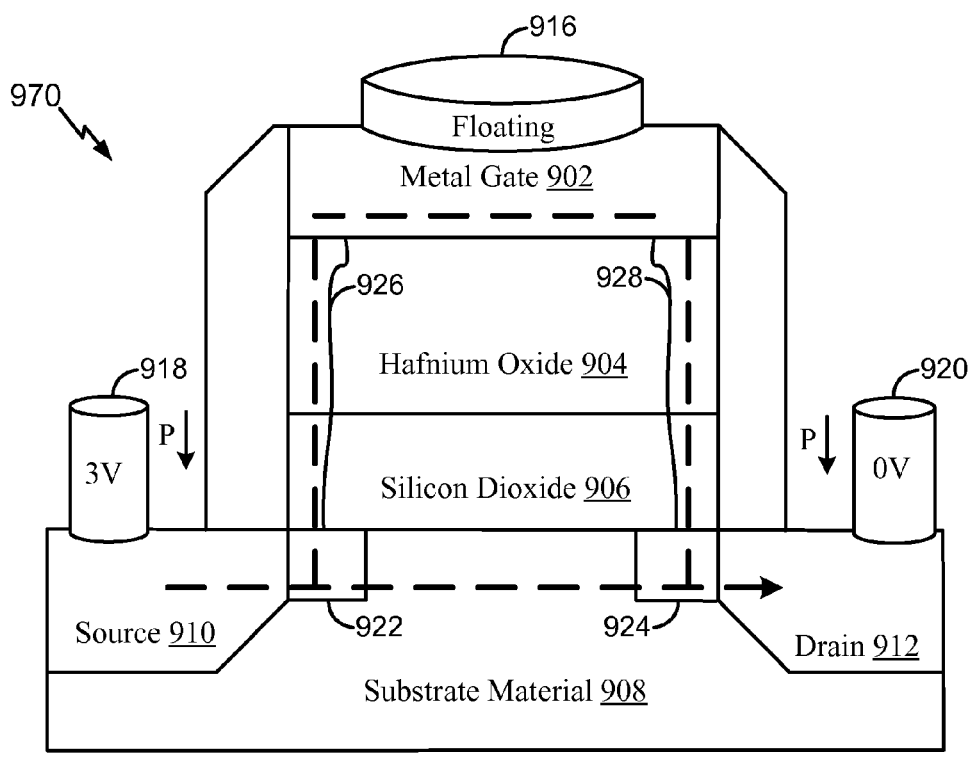
Figure 9D:
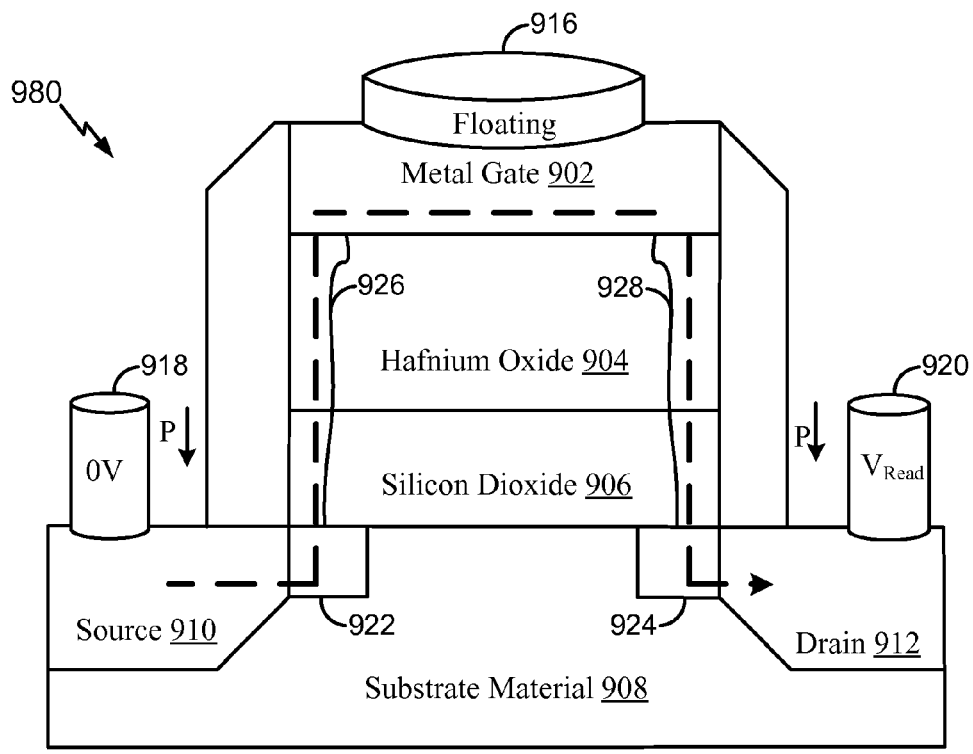

Another aspect 970 of the MTP memory device is shown in FIG. 9D. The techniques described with respect to the aspect 970 of the memory device may be performed after the techniques described with respect to the aspect 960. In the aspect 970, the second non-volatile state is programmed (e.g., written) at the MTP memory device using floating gate techniques. For example, the MTP memory device may be programmed to the second non-volatile state by applying voltages to the source 910 and to the drain 912, while no voltage is applied to the metal gate 902.

To illustrate, the second contact 918 may apply a source voltage of approximately 3V to the source 910, and the third contact 920 may apply a drain voltage of approximately 0V to the drain 912. Based on the voltage difference between the source/drain 910, 912 and the conductive paths 926, 928 formed during set/reset formations, current may flow from the source 910 to the drain 912, n-type carrier (electrons) may flow from the source 912 to the drain 910. For example, a channel in the substrate material 908 may form between the source 910 and the drain 912 and n-type ions (electrons) may flow through the channel. Additionally, n-type ions (electrons) may flow from the source 912 to the drain 910 via the conductive paths 926, 928 and the metal gate 902.

Based on the ion conduction, the dipole (P) may be placed in a downward orientation corresponding to the first non-volatile state. The threshold voltage of a transistor (e.g., the MTP memory device) may be relatively low based on the downward orientation of the dipole (P).

Another aspect 980 of the MTP memory device is shown in FIG. 9D. The techniques described with respect to the aspect 980 of the memory device may be performed after the techniques described with respect to the aspect 970. In the aspect 980, the second non-volatile state is sensed (e.g., read) at the MTP memory device using floating gate techniques. For example, the second non-volatile state may be sensed at the MTP memory device by applying voltages to the source 910 and to the drain 912, while no voltage is applied to the metal gate 902.

To illustrate, the second contact 918 may apply a source voltage of approximately 0V to the source 910, and the third contact 920 may apply the read voltage ($V_{read}$) to the drain 912. A sensing current may flow from the source 910 to the drain via the conductive paths 926, 928 and the metal gate 902. A sensing amplifier may compare the "conductivity" of the MTP memory device to that of a reference device (e.g., a reference transistor) to determine whether the MTP memory device is in a state that corresponds to the first non-volatile state or to the second non-volatile state in a similar manner as described with respect to FIG. 2.

The MTP memory device of FIGS. 9A-9D may enable non-volatile states to be programmed and sensed using a floating gate after switches are formed during the set and reset formations. For example, applying voltages to the source 910 and to the drain 912 after the switches have formed may adjust the orientation of the dipole (P) absent a voltage being applied to the metal gate 902. After formation of the switches (e.g., the conductive paths 926, 928), the conductive paths 926, 928 may enable current to flow between the source 910 and the drain 912 for sensing and programming operations absent voltage being applied to the metal gate 902. Adjusting the orientation of the dipole (P) may shift the threshold voltage of the MTP memory device in a similar manner as described with respect to FIG. 1. Shifting the threshold voltage of the MTP memory device may enable the MTP memory device (e.g., a MOS transistor) to be used as a non-volatile memory device.

Referring to FIG. 10, a flowchart of a particular aspect of a method 1000 for programming a multiple time programmable (MTP) memory device is shown. The method may be performed using the techniques described with respect to FIGS. 1-9.

The method 1000 includes performing a write operation to program an MTP memory device to a first non-volatile state or to a second non-volatile state, at 1002. For example, referring to the first aspect 100 of FIG. 1, a switching voltage (e.g., the switching voltage ($-V_{switch}$) of FIG. 3) may be applied to the metal gate 102 to change the orientation of the ferroelectric field ($E_{de}$) to the upward direction. Alternatively, referring to the first aspect 800 of FIG. 8, a relatively small number of electrons may be present in the hafnium oxide layer 104 to induce imaging charge in the substrate. When the relatively small amount of imaging charge is induced in substrate, the threshold voltage of the device may be reduced (as compared to when a relatively large amount of imaging charge is induced in substrate). Based on the low threshold voltage, the state of the device may correspond to the first non-volatile programmable state.

As another example, referring to the second aspect 150 of FIG. 1, a switching voltage (e.g., the switching voltage ($V_{switch}$) of FIG. 4) may be applied to the metal gate 102 to change the orientation of the ferroelectric field ($E_{de}$) to the downward direction. Alternatively, referring to the second aspect 850 of FIG. 8, a relatively large number of electrons may be present in the hafnium oxide layer 104 to induce a relatively large amount of imaging charge in the substrate. When a relatively large amount of imaging charge is induced in the substrate, the threshold voltage of the device may be increased (as compared to when a relatively small amount of imaging charge is induced in the substrate). Based on the high threshold voltage, the state of the device may correspond to the second non-volatile programmable state.

A read operation may be performed to determine whether the MTP memory device has the first non-volatile state or the second non-volatile state, at 1004. For example, referring to FIG. 1, a sensing amplifier may compare the "conductivity" of the MTP memory device to that of a reference device (e.g., a reference transistor) to determine whether the MTP memory device is in a state that corresponds to the first non-volatile state or to the second non-volatile state. For example, the current or voltage across the MTP memory device (e.g., a first cell) may be compared to the current or voltage across the reference device (e.g., a second cell) to determine the non-volatile state of the MTP memory device.

As another example, referring to FIG. 1, a sensing amplifier may compare the "conductivity" of the MTP memory device to that of a reference device (e.g., a reference transistor) to determine whether the MTP memory device is in a state that corresponds to the first non-volatile state or to the second non-volatile state.

Thus, the method 1000 of FIG. 10 enables use of a high-dielectric constant (k) metal-gate (HK/MG) device as a non-volatile memory device for a logic circuit.

Referring to FIG. 11, a block diagram of a wireless device 1100 including components operable to program a multiple time programmable (MTP) memory device 1190 is shown. The device 1100 includes a processor 1110, such as a digital signal processor (DSP), coupled to a memory 1132.

FIG. 11 also shows a display controller 1126 that is coupled to the processor 1110 and to a display 1128. A coder/decoder (CODEC) 1134 can also be coupled to the processor 1110. A speaker 1136 and a microphone 1138 can be coupled to the CODEC 1134. FIG. 11 also indicates that a wireless controller 1140 can be coupled to the processor 1110 and to an antenna 1142. A radio frequency (RF) interface 1180 may be disposed between the wireless controller 1140 and the antenna 1142.

The memory 1132 may be a tangible non-transitory processor-readable storage medium that includes executable instructions 1156. The instructions 1156 may be executed by a processor, such as the processor 1110 to perform the method 1000 of FIG. 10. For example, the instructions 1156 may be executable by the processor 1110 to cause the processor 1110 to bias terminals of the MTP memory device 1190. In a particular aspect, the MTP memory device 1190 may correspond to, or include, the device of FIGS. 1 and 8, the MTP memory device 202 of FIGS. 2-4, the MTP memory device 504 of FIGS. 5-7, the device of FIGS. 9A-9D, an array of MTP memory devices, or any combination thereof. In another particular aspect, the MTP memory device 1190 may be included in the processor 1110 or other logic that includes CMOS circuitry.

In a particular aspect, the processor 1110, the display controller 1126, the memory 1132, the CODEC 1134, and the wireless controller 1140 are included in a system-in-package or system-on-chip device 1122. In a particular aspect, an input device 1130 and a power supply 1144 are coupled to the system-on-chip device 1122. Moreover, in a particular aspect, as illustrated in FIG. 11, the display 1128, the input device 1130, the speaker 1136, the microphone 1138, the antenna 1142, and the power supply 1144 are external to the system-on-chip device 1122. However, each of the display 1128, the input device 1130, the speaker 1136, the microphone 1138, the antenna 1142, and the power supply 1144 can be coupled to a component of the system-on-chip device 1122, such as an interface or a controller.

Although the MTP memory device 1190 is integrated into the wireless device 1100 of FIG. 11, in other aspects, the MTP memory device 1190 may be integrated into a communications device, a personal digital assistant (PDA), a set top box, a music player, a video player, an entertainment unit, a navigation device, a fixed location data unit, a computer, or a combination thereof.

Additionally, the foregoing disclosed devices and functionalities, e.g., as described in reference to any one or more of FIGS. 1-10, may be designed and configured into computer files (e.g., RTL, GDSII, GERBER, etc.) stored on computer readable media. Some or all of such files may be provided to fabrication handlers who fabricate devices based on such files. Resulting products include semiconductor wafers that are then cut into semiconductor die and packaged into a semiconductor chip. The semiconductor chips may be employed in the devices described above.

In conjunction with the described aspects, an apparatus includes means for receiving a gate voltage signal. For example, the means for receiving the gate voltage signal may include or correspond to the metal gate 102 of FIGS. 1 and 8, the metal gate 902 of FIGS. 9A-9D, one or more other devices, circuits, modules, or any combination thereof. The apparatus may also include means for conducting current. For example, the means for conducting current may include the substrate material 108 of FIGS. 1 and 8, the substrate 908 of FIGS. 9A-9D, one or more other devices, circuits, modules, or any combination thereof.

The apparatus may also include means for isolating the means for conducting current from the means for receiving the gate voltage signal. The means for isolating may include means for altering a threshold voltage of a transistor. The means for altering the threshold voltage may be in contact with the means for receiving the gate voltage signal and may include a hafnium oxide layer in contact with a silicon dioxide layer. For example, the means for altering the threshold voltage of the transistor may include the oxide layers 104, 106 of FIGS. 1 and 8, the oxide layers 904, 906 of FIGS. 9A-9D, one or more other devices, modules, or any combination thereof.

Those of skill would further appreciate that the various illustrative logical blocks, configurations, modules, circuits, and algorithm steps described in connection with the aspects disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the aspects disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed aspects is provided to enable a person skilled in the art to make or use the disclosed aspects. Various modifications to these aspects will be readily apparent to those skilled in the art, and the principles defined herein may be applied to other aspects without departing from the scope of the disclosure. Thus, the present disclosure is not intended to be limited to the aspects shown herein but is to be accorded the widest scope possible consistent with the principles and novel features as defined by the following claims.

What is claimed is:

1. An apparatus comprising:
   a multiple time programmable (MTP) memory device, the MTP memory device comprising:
   a metal gate;
   a substrate material; and
   an oxide structure between the metal gate and the substrate material, the oxide structure comprising a hafnium oxide layer and a silicon dioxide layer, the hafnium oxide layer in contact with the metal gate and in contact with the silicon dioxide layer, the silicon dioxide layer in contact with the substrate material, wherein the MTP memory device comprises a transistor, and wherein a non-volatile state of the MTP memory device is based on an orientation of a dipole between the hafnium oxide layer and the silicon dioxide layer.

2. The apparatus of claim 1, further comprising a word line coupled to the metal gate and configured to apply, to the metal gate during a write operation, a switching voltage configured to cause the orientation of the dipole to change direction.

3. The apparatus of claim 1, further comprising a sensing amplifier configured to sense the non-volatile state of the MTP memory device based on the orientation of the dipole, wherein the MTP memory device has a first non-volatile state when the dipole has a first orientation, and wherein the MTP memory device has a second non-volatile state when the dipole has a second orientation.

4. The apparatus of claim 3, wherein the transistor has a first threshold voltage when the dipole has the first orientation.

5. The apparatus of claim 4, wherein the transistor has a second threshold voltage when the dipole has the second orientation.

6. The apparatus of claim 1, wherein the dipole comprises a ferroelectric dipole.

7. The apparatus of claim 1, wherein the non-volatile state is programmed at the MTP memory device by application of a source voltage to a source of the transistor, by application of a drain voltage to a drain of the transistor, and by the metal gate being operated as a floating gate.

8. The apparatus of claim 1, further comprising at least one semiconductor die into which the metal gate, the substrate material, and the oxide structure are integrated.

9. The apparatus of claim 1, further comprising a communications device, a mobile device, a personal digital assistant (PDA), a set top box, a music player, a video player, an entertainment unit, a navigation device, a fixed location data unit, a computer, or a combination thereof, into which the MTP memory device is integrated.

10. A method comprising:
    performing a write operation to program a multiple time programmable (MTP) memory device that includes a transistor to a first non-volatile state associated with a first orientation of a dipole between a hafnium oxide layer of an oxide structure of the transistor and a silicon dioxide layer of the oxide structure of the transistor or to a second non-volatile state associated with a second orientation of the dipole, the hafnium oxide layer in contact with a metal gate of the transistor and in contact with the silicon dioxide layer, the silicon dioxide layer in contact with a substrate material of the transistor; and
    sensing the first non-volatile state or the second non-volatile state based on an orientation of the dipole.

11. The method of claim 10, wherein the first orientation is opposite the second orientation.

12. The method of claim 10, wherein the transistor has a first threshold voltage when the dipole has the first orientation.

13. The method of claim 12, wherein the transistor has a second threshold voltage when the dipole has the second orientation.

14. The method of claim 10, wherein the dipole comprises a ferroelectric dipole.

15. The method of claim 10, wherein programming a non-volatile state of the MTP memory device comprises:
    applying a source voltage to a source of the transistor;
    applying a drain voltage to a drain of the transistor; and
    operating the metal gate as a floating gate.

16. A non-transitory computer-readable medium comprising instructions that, when executed by a processor, cause the processor to:

perform a write operation to program a multiple time programmable (MTP) memory device that includes a transistor to a first non-volatile state associated with a first orientation of a dipole between a hafnium oxide layer of an oxide structure of the transistor and a silicon dioxide layer of the oxide structure of the transistor or to a second non-volatile state associated with a second orientation of the dipole, the hafnium oxide layer in contact with a metal gate of the transistor and in contact with the silicon dioxide layer, the silicon dioxide layer in contact with a substrate material of the transistor; and sense the first non-volatile state or the second non-volatile state based on an orientation of the dipole.

17. The non-transitory computer-readable medium of claim 16, wherein the first orientation is opposite the second orientation.

18. The non-transitory computer-readable medium of claim 16, wherein the transistor has a first threshold voltage when the dipole has the first orientation.

19. The non-transitory computer-readable medium of claim 18, wherein the transistor has a second threshold voltage when the dipole has the second orientation.

20. The non-transitory computer-readable medium of claim 16, wherein the dipole comprises a ferroelectric dipole.

21. An apparatus comprising:
means for receiving a gate voltage signal;
means for conducting current; and
means for isolating the means for conducting current from the means for receiving the gate voltage signal, wherein the means for receiving the gate voltage signal, the means for conducting current, and the means for isolating are included in a multiple time programmable (MTP) memory device, wherein the MTP memory device includes a transistor, wherein the means for isolating includes means for altering a threshold voltage of the transistor, the means for altering the threshold voltage in contact with the means for receiving the gate voltage signal and comprising a hafnium oxide layer in contact with a silicon dioxide layer, and wherein a non-volatile state of the MTP memory device is based on an orientation of a dipole between the hafnium oxide layer and the silicon dioxide layer.

22. The apparatus of claim 21, further comprising means for applying, to the means for receiving the gate voltage signal during a write operation, a switching voltage configured to cause the orientation of the dipole to change direction.

23. The apparatus of claim 21, further comprising means for sensing the non-volatile state of the MTP memory device based on the orientation of the dipole, wherein the MTP memory device has a first non-volatile state when the dipole has a first orientation, and wherein the MTP memory device has a second non-volatile state when the dipole has a second orientation.

24. The apparatus of claim 23, wherein the transistor has a first threshold voltage when the dipole has the first orientation.

25. The apparatus of claim 24, wherein the transistor has a second threshold voltage when the dipole has the second orientation.

26. The apparatus of claim 21, wherein the dipole comprises a ferroelectric dipole.

27. The apparatus of claim 3, wherein the first orientation is opposite the second orientation.

28. The apparatus of claim 23, wherein the first orientation is opposite the second orientation.

* * * * *